(12) United States Patent
Beatty

(10) Patent No.: US 7,439,739 B2
(45) Date of Patent: Oct. 21, 2008

(54) ANTI-ALIASED MAGNETIC RESONANCE IMAGE RECONSTRUCTION USING PARTIALLY PARALLEL ENCODED DATA

(75) Inventor: Philip J. Beatty, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 49 days.

(21) Appl. No.: 11/456,772

(22) Filed: Jul. 11, 2006

(65) Prior Publication Data

US 2008/0012562 A1 Jan. 17, 2008

(51) Int. Cl.
*G01V 3/00* (2006.01)
(52) U.S. Cl. .................................. 324/309; 324/307
(58) Field of Classification Search ......... 324/300–322; 600/407–435; 333/219–235
See application file for complete search history.

(56) References Cited

U.S. PATENT DOCUMENTS

| 5,910,728 | A | * | 6/1999 | Sodickson | 324/309 |
| 6,289,232 | B1 | * | 9/2001 | Jakob et al. | 600/410 |
| 6,841,998 | B1 | * | 1/2005 | Griswold | 324/309 |
| 7,202,663 | B2 | * | 4/2007 | Huang | 324/307 |
| 2005/0100202 | A1 | * | 5/2005 | Huang | 382/128 |
| 2006/0186941 | A1 | * | 8/2006 | Pruessmann et al. | 327/307 |
| 2007/0013374 | A1 | * | 1/2007 | Griswold et al. | 324/309 |
| 2007/0096732 | A1 | * | 5/2007 | Samsonov et al. | 324/309 |
| 2007/0182411 | A1 | * | 8/2007 | Bammer et al. | 324/307 |
| 2008/0012562 | A1 | * | 1/2008 | Beatty | 324/307 |

OTHER PUBLICATIONS

Beatty et al., "Anti-aliasing Partially Parallel Encoded Acquisition Reconstruction (APPEAR)", Submitted to MRM in Feb. 2006 (unpublished), 44 pages.

* cited by examiner

*Primary Examiner*—Diego Gutierrez
*Assistant Examiner*—Tiffany A Fetzner
(74) *Attorney, Agent, or Firm*—Beyer Law Group LLP

(57) ABSTRACT

Disclosed is a method of providing magnetic resonance image reconstruction from k-space data obtained from any trajectory of k-space using multiple receiver coils. An image is constructed for data from each coil, and then the multiple coil images are combined such as by using sum of squares of image data, for example.

8 Claims, 13 Drawing Sheets

ANTI-ALIASED MAGNETIC RESONANCE IMAGE RECONSTRUCTION USING PARTIALLY PARALLEL ENCODED DATA

FEDERALLY-SPONSORED RESEARCH OR DEVELOPMENT

This invention was made with Government support under contracts HL039297, HL075803, & RR09784 awarded by the National Institutes of Health. The Government Has certain rights in this invention.

BACKGROUND OF THE INVENTION

This invention relates generally to magnetic resonance imaging (MRI), and more particularly the invention relates to reconstruction of partially parallel encoded MRI data using anti-aliasing, hereinafter referred to as APPEAR.

In magnetic resonance imaging (MRI), it is well known that multiple receiver coils can be used to reduce the gradient encoding required and, consequently, the time needed to acquire an image. This is because multiple receiver coils enable the image to be encoded in parallel—at each sample time each receiver collects a differently encoded datum. The acquired data are the result of encoding with both the gradients and the spatial sensitivity of the receiver coils (coil sensitivities) and no longer correspond to samples in a common k-space.

Over the past few years, many reconstruction methods that take advantage of sensitivity encoding have been developed and improved. The original SMASH method [D. K. Sodickson and W. J. Manning, "Simultaneous acquisition of spatial harmonics (SMASH): fast imaging with radiofrequency coil arrays," Magn. Reson. Med., vol. 38, no. 4, pp. 591-603, 1997.] is limited to Cartesian k-space trajectories and places requirements on the coil sensitivity functions that are difficult to achieve in practice. SENSitivity Encoding (SENSE) theory [K. P. Pruessmann, M. Weiger, M. B. Scheidegger, and P. Boesiger, "SENSE: sensitivity encoding for fast MRI," Magn. Reson. Med., vol. 42, no. 5, pp. 952-62, 1999.], [K. P. Pruessmann, M. Weiger, P. Bornert, and P. Boesiger, "Advances in sensitivity encoding with arbitrary k-space trajectories," Magn. Reson. Med., vol. 46, no. 4, pp. 638-51, 2001.] relaxes the requirement that the coil sensitivities have specific profiles and provides an iterative method for reconstructing arbitrary k-space trajectories. The SPACE-RIP [W. E. Kyriakos, L. P. Panych, D. F. Kacher, C. F. Westin, S. M. Bao, R. V. Mulkern, and F. A. Jolesz, "Sensitivity profiles from an array of coils for encoding and reconstruction in parallel (SPACE RIP)," Magn. Reson. Med., vol. 44, no. 2, pp. 301-8, 2000.] method allows non-iterative reconstruction for k-space trajectories which do not fall on a Cartesian grid in one dimension, while the recently introduced PARS method [E. N. Yeh, C. A. McKenzie, M. A. Ohliger, and D. K. Sodickson, "Parallel magnetic resonance imaging with adaptive radius in k-space (PARS): constrained image reconstruction using k-space locality in radiofrequency coil encoded data," Magn. Reson. Med., vol. 53, no. 6, pp. 1383-92, 2005.] can reconstruct one, two and three dimensional arbitrary k-space trajectories without iteration. All of the above methods require the coil sensitivity functions to be found to a high degree of accuracy. Finding the coil sensitivities can be accomplished by performing a full field-of-view (FOV) initial calibration scan before acquiring the image data [K. P. Pruessmann, M. Weiger, M. B. Scheidegger, and P. Boesiger, "SENSE: sensitivity encoding for fast MRI," Magn. Reson. Med., vol. 42, no. 5, pp. 952-62, 1999.] or by designing the k-space trajectory such that a low resolution full FOV scan can be extracted from the acquired data [C. A. McKenzie, E. N. Yeh, M. A. Ohliger, M. D. Price, and D. K. Sodickson, "Self-calibrating parallel imaging with automatic coil sensitivity extraction," Magn. Reson. Med., vol. 47, no. 3, pp. 529-38, 2002.]. In practice it is difficult to obtain the coil sensitivity functions without errors and, even when small errors exist in the coil sensitivity functions used in the reconstruction process, these errors can lead to visible image artifacts.

PILS [M. A. Griswold, P. M. Jakob, M. Nittka, J. W. Goldfarb, and A. Haase, "Partially parallel imaging with localized sensitivities (PILS)," Magn. Reson. Med., vol. 44, no 4, pp 602-9, 2000.] is a non-iterative method that does not require the coil sensitivities to be known with great accuracy and works with arbitrary k-space trajectories. However, the PILS method is only viable when the coil sensitivities are sufficiently localized in space.

GRAPPA [M. A. Griswold, P. M. Jakob, R. M. Heidemann, M. Nittka, V. Jellus, J. Wang, B. Kiefer, and A. Haase, "Generalized autocalibrating partially parallel acquisitions (GRAPPA)," Magn. Reson. Med., vol. 47, no. 6, pp. 1202-10, 2002.], as well as predecessors AUTO-SMASH [P. M. Jakob, M. A. Griswold, R. R. Edelman, and D. K. Sodickson, "AUTO-SMASH: a self-calibrating technique for SMASH imaging. Simultaneous Acquisition of Spatial Harmonics," Magma, vol. 7, no. 1, pp. 42-54, 1998.] and VD-AUTO-SMASH [R. M. Heidemann, M. A. Griswold, A. Haase, and P. M. Jakob, "VD-AUTO-SMASH imaging," Magn. Reson. Med., vol. 45, no. 6, pp. 1066-74, 2001.], uses an autocalibration technique that does not require the coil sensitivities to be known and avoids problems in coil sensitivity estimation that affect the previous methods. For Cartesian trajectories, autocalibration is able to remove the aliasing artifacts caused by reduced gradient encoding. While the autocalibration technique has been extended to specific non-Cartesian trajectories [M. A. Griswold, R. M. Heidemann, and P. M. Jakob, "Direct parallel imaging reconstruction of radially sampled data using GRAPPA with relative shifts," in Proc. Eleventh ISMRM, 2003, p2349.], [K. A. Heberlein, Y. Kadah, and X. Hu, "Segmented spiral parallel imaging using GRAPPA," in Proc. Twelfth ISMRM, 2004, p. 328.], [K. A. Heberlein and X. Hu, "Auto-calibrated parallel imaging using dual-density spirals," in Second International Workshop on Parallel MRI, 2004.], in doing so, it loses some of its ability to successfully remove all of the aliasing artifacts.

We develop a new calibration technique which we call the local projection calibration technique. We show that this new technique is able to remove the aliasing artifacts from arbitrary k-space trajectories, without needing to estimate the coil sensitivity functions. The autocalibration technique as used by GRAPPA for Cartesian trajectories is a special case of the local projection calibration technique.

In their development of SENSE theory [K. P. Pruessmann, M. Weiger, M. B. Scheidegger, and P. Boesiger, "SENSE: sensitivity encoding for fast MRI," Magn. Reson. Med., vol. 42, no. 5, pp. 952-62, 1999.], Pruessmann et al. provide a general formulation for encoding with coil sensitivities. We extend the linear algebra framework of SENSE to develop the local projection calibration technique. Using this linear algebra framework, we show that the local projection calibration technique is fundamentally different from techniques that use low resolution images to construct coil sensitivity estimations. Moreover, the local projection calibration technique avoids the main difficulties in estimating coil sensitivities from low resolution data: Gibbs ringing distortion and an inability to deal with sensitivity maps with high frequency content.

The present invention is directed to magnetic resonance image reconstruction and non-iterative method using a combination of gradient encoding and receiver coil sensitivities, but does not require coil sensitivity functions and can be used with arbitrary k-space trajectories. A local projection calibration technique removes aliasing artifacts caused by reduced gradient encoding.

SUMMARY OF THE INVENTION

The invention provides magnetic resonance image reconstruction from k-space data obtained from any trajectory of k-space using multiple receiver coils. An image is constructed for data from each coil, and then the multiple coil images are combined such as by using sum of squares of image data, for example.

K-space data for each receiver coil image is synthesized on a full field of view (FOV) Cartesian grid. Data points in a FOV can be measured or derived from corresponding data points from other coils. Other k-space samples can be synthesized from a weighted sum or linear combination of the data points as measured or derived from other coils. In determining linear weights, a subset of the entire k-space of each receiver is oversampled compared to the field of view. This region is referred to as the "central" region and is usually in the central part of k-space corresponding to low Spatial frequency data. Any unsampled data point in the central region can be synthesized from actual sampled k-space data within the Central region or the coil without reference to data from other coils. An unsampled data point within the central region can be apodized data, or data obtained by filtering k-space data to suppress image content outside of the FOV. In a manifestation of the invention the linear combination weights are determined using the synthesized data by identifying in the central region a plurality of instances of the same or similar patterns of k-space locations around a given k-space location using the synthesized k-space data, where the k-space synthesized data is derived from measured k-space data in the central region of each coil and where the synthesized k-space data differs from the measured k-space data.

In determining combination weights of data points for a synthesized sample, first a pattern of data points is identified around the k-space sample, and then the same or similar pattern of data point is identified in the central region around a corresponding known or synthesized data point in the central region. The weights found using the central region data points can then be used for data points in the pattern outside of the central region in synthesizing a sample.

Once a full set of k-space data is available from direct measurement and by synthesis, the data is Fourier transformed to provide an image for each coil. The coil images are then combined to form a composite image.

The invention takes advantage of multiple receiver coil data to remove aliasing artifacts in non-Cartesian k-space trajectories without needing to estimate the coil sensitivity functions. The invention and object and features thereof will be more readily apparent from the following detailed description and appended claims when taken with the drawings.

BRIEF DESCRIPTION OF THE DRAWINGS

FIG. 5a illustrates the synthesis is performed for different shifted versions of the acquired vector. FIG. 5b without apodization or oversampling, the accuracy of the synthesis is poor. FIG. 5c illustrates the acquired locations oversample the FOV with an oversampling factor of 1.5 and an apodized version of the gradient encoding vector at $k_x=0$ is synthesized. In this case, all of the synthesized gradient encoding vectors overlap with the apodization vector target, showing that this synthesis can be done with high accuracy.

FIG. 7b illustrates sampling density of the trajectory in FIG. 7a.

FIG. 8a: Reconstruction of Shepp-Logan numerical phantom using the PARS method; FIG. 8b: Reconstruction of the same dataset as in FIG. 8a using the APPEAR method.

FIG. 9a: Weights are found with PARS using ideal coil sensitivities. FIG. 9b: Weights are found using PARS, where the coil sensitivities are estimated from the central region data. FIG. 9c: Weights are calculated using the APPEAR method. By minimizing the magnetization-weighted error in the estimated encoding function, APPEAR is very accurate in the area where signal is being acquired. All images have been windowed up 100× with respect to the magnitude of the encoding function being synthesized.

FIGS. 10a-c were all reconstructed from the same data, as were FIGS. 10d-f.

FIGS. 11a-c were all reconstructed from the same data, as were FIGS. 11d-f The artifact in Fig. 11b can be found by looking at the same location as the artifact in FIG. 11a.

FIG. 12a −5°, FIG. 12b 0°, FIG. 12c 5°. By disregarding small rotational differences in pattern sets, as is done with autocalibration for non-Cartesian trajectories, these weights lead to significantly larger errors in the estimated encoding vectors. By ensuring the integrity of the pattern sets, APPEAR achieves much smaller errors in the estimated encoding vector as shown in FIG. 9(c).

DETAILED DESCRIPTION OF ILLUSTRATIVE EMBODIMENTS

Figures 1A, 1B, 1C:
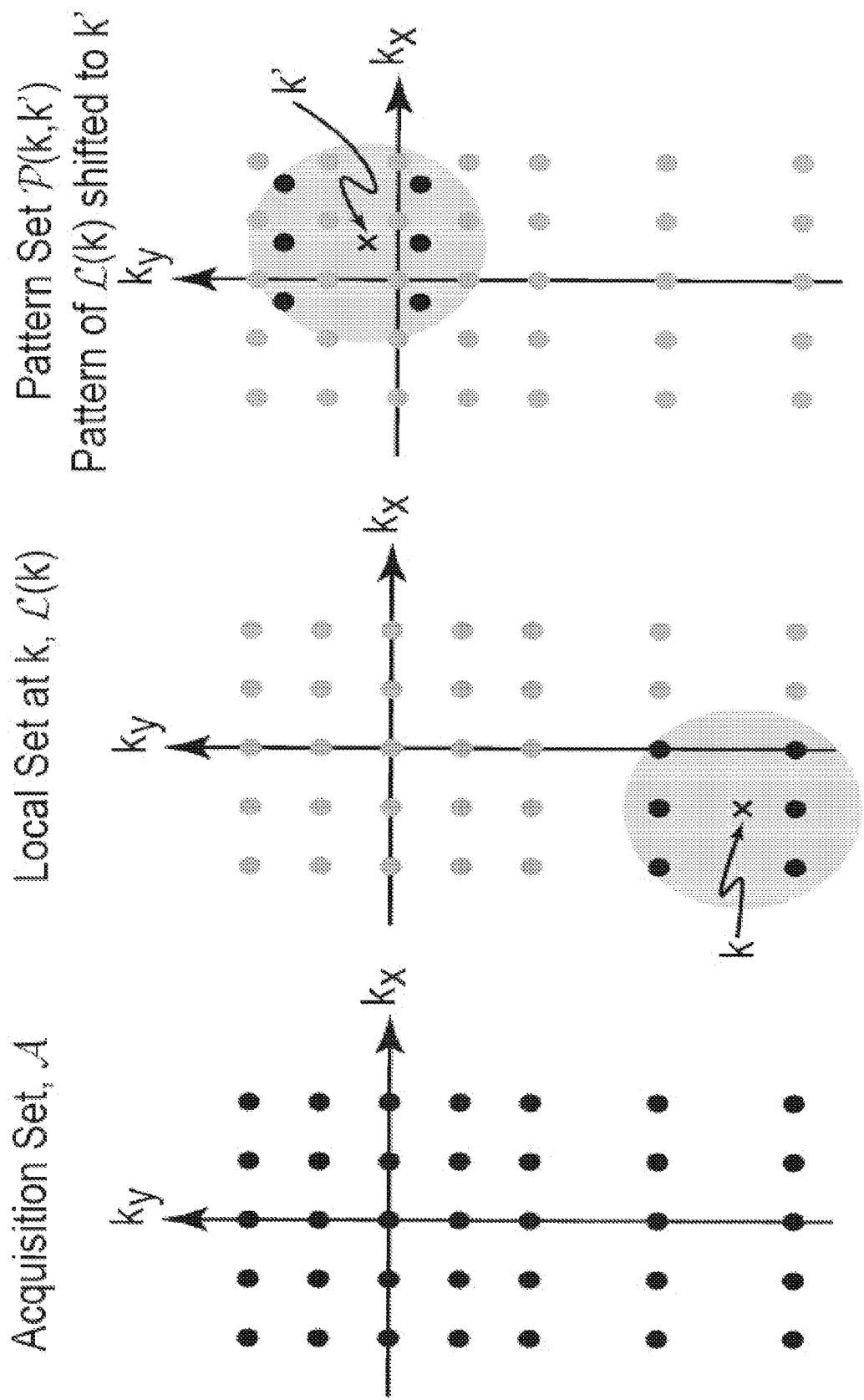
FIG. 1a illustrates the acquisition set, A, which contains all of the acquired data locations.
FIG. 1b illustrates the local set, L(k), contains the acquired data locations in a radius κ around k.
FIG. 1c illustrates the pattern set, P(k,k'), contains the locations in the pattern of L(k), but centered around k'; where the locations in P(k,k') are not necessarily in the acquisition set and can be different from L(k').

Consider first the theory underlying sensitivity encoding, or SENSE, which can be extended to provide an understanding of local projection calibration as used in the present invention.

In MRI, data acquisition can be viewed as analyzing the spatially varying transverse magnetization, m(r), by projecting it onto a collection of encoding functions which take the form $e_j(k, r) = s_j(r)g(k, r)$ where $s_j(r)$ is the sensitivity of receiver coil j and $g(k, r) = \exp(-i2\pi k^T r)$ is the gradient encoding function for location k. When only one receiver coil is used, each encoding function can be uniquely identified by a specific location in k-space. When using multiple coils, the notion of location can be extended by defining an encoding location to be the pair of values, (j, k), consisting of an integer coil index and continuous-valued three-tuple k-space location k, that uniquely identifies an encoding function. The projection of m(r) onto an encoding function is accomplished by the integral $$d_j(k) = \int_V e_j(k, r)m(r)dr, \quad (1)$$

where dj(k) is the resulting datum acquired at encoding location (j, k).

Reconstruction can be viewed as an attempt to synthesize the magnetization image from the results of this analysis. Typically, a finite number of data points are acquired and a finite number of voxel values are reconstructed. The acquisition set, A, contains the encoding locations acquired in the scan, $$A = \{(j,k) | d_j(k) \text{ was acquired in the scan}\}, \quad (2)$$

and the acquired data can be assembled in the vector $d_A$. Since the encoding is linear, a linear reconstruction is appropriate, which can be written as $$\hat{m} = R_A d_A, \quad (3)$$

where the vector $\hat{m}$ is the reconstruction estimate of the voxel values and $R_A$ is the contains reconstruction matrix, each row of which synthesizes an image voxel value from the acquired analysis data.

Pruessmann et al. showed that when the magnetization, m(r), can be approximated with a Dirac delta function at the center of each voxel, the reconstruction matrix, $R_A$, that minimizes the noise in the reconstructed image can be expressed as $$R_A = E_A^\dagger, \quad (4)$$

where $E_A^{554\dagger} = (E_A^H \Psi_A^{-1} E_A)^{-1} E_A^H \Psi_A^{-1}$ is a pseudo-inverse of the encoding matrix $E_A$. We will discuss $E_A$ in more detail shortly. $\Psi_A$, the sample noise matrix, is included to calculate the pseudo inverse that minimizes the noise in the reconstructed image. In general, this description assumes the Dirac delta voxel approximation, allowing functions of r to be written as vectors with a total number of elements of $N_v$, the total number of voxels. With this discretization of the magnetization, Eq. 1 can be written as $$d_j(k) = e_j^T(k)m, \quad (5)$$

where m is the $N_v \times 1$ magnetization vector, containing the magnetizations of the voxels, and $e_j(k)$ is the $N_v \times 1$ encoding vector for encoding location (j, k). Note that the encoding vector can still be broken up into the vector representation of the sensitivity and gradient encoding terms, i.e. $e_j(k) = s_j \cdot g(k)$, where $s_j$ is multiplied by g(k) using the Hadamard, or entry-wise, product.

Each row of the encoding matrix, $E_A$, consists of an encoding vector in the acquisition set such that $$d_A = E_A m. \quad (6)$$

SENSE theory assumes that the coil sensitivities are known, allowing the encoding matrix $E_A$ and any encoding vector $e_j(k)$ to be calculated.

When the magnetization is fully encoded, the set of encoding vectors comprising $E_A$ span the space of the magnetization vector m. In this case, Eq. 4 can be used to find the reconstruction matrix and the image can be reconstructed using Eq. 3. Since the final objective of any reconstruction method is to reconstruct the image, this is usually how SENSE theory is employed.

Since the APPEAR method, as shown later, involves synthesis of unacquired data, we note that, alternatively, SENSE theory can be employed to synthesize, from the acquired data, any datum $\hat{d}_j(k)$ for an unacquired location k within the extent of acquired k-space. As SENSE theory assumes that the coil sensitivities are known (and hence the encoding functions are known), we can replace the magnetization vector in Eq. 5 with the SENSE estimate of the magnetization from Eq. 3:

$$\hat{d}_j(k) = e_j^T(k)\hat{m} \qquad (7)$$

$$= e_j^T(k)R_{\mathcal{A}}d_{\mathcal{A}} \qquad (8)$$

$$= \sum_{(j',k')\in\mathcal{A}} w_{j,j',\mathcal{A}}(k,k')d_{j'}(k'). \qquad (9)$$

where $w_{j,j',\mathcal{A}}(k,k')$ is a complex scalar value formed by multiplying $e_j^T(k)|$ by the column of $R_A$ corresponding to the encoding location (j', k'). From Eq. 9 it is clear that the estimated datum, $\hat{d}_j(k)$, is simply a linear combination of the acquired data. The linear combination weights can be denoted by the vector $w_{j,A}^T(k)=e_j^T(k)R_A$, allowing Eq. 9 to be rewritten as $$\hat{d}_j(k)=w_{j,A}^T(k)d_A. \qquad (10)$$

While Eq. 10 is very useful for showing how an unacquired datum can be synthesized from the acquired data, it does not provide much intuition as to the quality of the synthesis. A better intuition can be obtained by expressing the synthesized datum in terms of an estimated encoding vector. This can be accomplished by substituting Eq. 6 into Eq. 10:

$$\hat{d}_j(k)=w_{j,A}^T(k)E_A m=\hat{e}_{j,A}^T(k)m. \qquad (11)$$

The estimated encoding vector, $\hat{e}_{j,A}(k)$ is a linear combination of the encoding vectors of the acquired data $$\hat{e}_{j,A}^T(k)=w_{j,A}^T(k)E_A. \qquad (12)$$

Since we use the idea of an estimated encoding vector extensively as we develop the theory for local projection calibration, it is useful to discuss it in further detail. While both the magnetization and the encoding vector are written as vectors to take advantage of matrix notation, both are best viewed as images. Acquiring a datum as in Eq. 5 can then be viewed as multiplying the magnetization image by an encoding vector image and summing all of the resultant voxel values. By expressing a synthesized datum in terms of an estimated encoding vector, as in Eq. 11, the synthesized datum can also be viewed as the result of summing the multiplication of two images (the magnetization image and the estimated encoding vector image). If the estimated encoding vector for an encoding location is not the same as the true encoding vector for that location, the synthesized datum can be in error. This can be made more concrete by defining the error in the estimated encoding vector as the vector $$\epsilon_{j,A}^T(k)=\hat{e}_{j,A}^T(k)-e_j^T(k). \qquad (13)$$

The error in the estimated encoding vector can also be viewed as an image and the error in the synthesized datum can then be calculated by multiplying the magnetization image by this error image and summing the voxel values. To ensure accurate synthesis, the error in an estimated encoding vector image should be zero, or sufficiently close to zero, at any voxel locations that contain magnetization. Note, however, that an estimated encoding vector and its associated error vector are dependent solely on the linear combination weights and the encoding vectors of the acquired data; they do not depend on the magnetization itself. Thus, the error in the estimated encoding vector, which can be viewed as an image, gives us the ability to see the quality of a set of linear combination weights independently from the magnetization being imaged.

When the magnetization is fully encoded, and the coil sensitivity functions known, the linear combination weights calculated by SENSE give a perfect estimate of the encoding vector. Since typically the magnetization is over-encoded, with more data acquired than voxels reconstructed, the SENSE weights are not the only weights that would give a perfect estimate of the encoding vector. However, when the acquired data contains noise, these SENSE weights do give the linear combination that minimizes the noise in the synthesized datum.

As can be seen from Eq. 10, when SENSE is used to synthesize data at unacquired k-space locations, it uses a linear combination, similar to GRAPPA, PARS and APPEAR. Since all of these methods can be expressed as procedures for synthesizing unacquired data using a linear combination, the differences in image quality between these methods can be attributed to different choices for linear combination weight values. When the coil sensitivities are known, the weights calculated by SENSE allow the encoding vectors to be perfectly estimated, resulting in removal of aliasing artifacts. However, when errors exist in the coil sensitivity estimates, these errors are propagated to the weights calculated by SENSE, leading to imperfect estimations of the encoding vectors and possible residual aliasing artifacts. In the next section we show how APPEAR uses local projection calibration to obtain linear combination weights without estimating the coil sensitivities, and show that these weights give estimated encoding vectors with very little error.

We now describe the APPEAR method for finding linear combination weights used to synthesize unacquired data. After using the APPEAR method to synthesize data across a full-FOV grid for each coil, separate coil images can be obtained by computing the Fourier transform of each grid. These coil images can then be combined to form a composite image; for this embodiment, the combination is done using sum-of-squares.

We divide the development of the APPEAR method into two sections. In the first section, we develop the local projection calibration technique and show that the technique is able to find high quality linear combination weights. While the local projection calibration technique does not assume that the coil sensitivity functions are known, it does make the assumption that within a central region of k-space, the data values are known or can be found for every encoding location (j, k). Since invariably only a finite amount of data is acquired, we must be able to synthesize appropriate values for unacquired locations within the central region.

In the second section, we develop an interpolation scheme that allows a data value at any encoding location within a sufficiently sampled central region of k-space to be synthesized from the acquired data. The APPEAR method uses the interpolation scheme developed in the second section to synthesize data at encoding locations within the central region as needed by the local projection calibration technique.

Local Projection Calibration: Despite Eq. 12, a small subset of the acquired encoding vectors (a few rows of $E_A$) is sufficient for estimating an unacquired encoding vector, when the chosen subset of acquired encoding vectors are local to the k-space location of the encoding vector to be estimated. By limiting the number of acquired encoding vectors used in the estimate, local projection calibration can find high-accuracy weights using the sufficiently sampled central region of k-space. Self-calibrating PARS [5] also synthesizes an unacquired datum from acquired data in a limited local neighborhood in k-space, and uses a sufficiently sampled central region of k-space for calibration. However, the self-calibration technique [6] used by PARS, which uses the sufficiently sampled central region to estimate the coil sensitivities, is different from the local projection calibration technique (which does not estimate the coil sensitivities) and finds a different set of linear combination weights. In this section, we develop the local projection calibration technique, leaving a comparison between self-calibrating PARS and local projection calibration for the discussion section.

We start by introducing some notation that allows us to work with local acquired data. We then specify how the weights for the local neighborhood are calculated. Finally, we show that when the weights are calculated in this way, the errors in the estimated encoding vectors weighted by the magnetization are minimized.

Instead of using the entire acquisition set, A, we define the local set, L(k), as a set of acquired locations local to k-space location k:

$$L(k) = \{(j, k+\Delta k) | (j, k+\Delta k) \in A, \|\Delta k\| < \kappa\}. \quad (14)$$

Essentially, L(k), as described in Table III and illustrated in FIG. 1, contains all of the acquired locations from all coils within a radius κ of k. By replacing the acquisition set, A, with the local set, L(k), in Eq. 10, the synthesis of a datum from locally acquired data can be written as $$\hat{d}_j(k) = w_{j, L(k)}^T(k) d_{L(k)} \quad (15)$$

and the associated estimated encoding vector can be expressed by replacing the acquisition set, A, with the local set, L(k), in Eq. 12:

$$\hat{e}_{j, L(k)}^T(k) = w_{j, L(k)}^T(k) E_{L(k)}. \quad (16)$$

Each row of $E_{L(k)}$ contains an encoding vector at one of the locations in L(k). Note that $E_{L(k)}$ has far fewer rows than $E_A$ and the encoding vectors comprising $E_{L(k)}$ are not expected to span the space of the magnetization vector m. As such, $\hat{e}_{j, L(k)}^T(k)$ will not be a perfect estimate of $e_j^T(k)$. Rather, we desire the linear combination weights, $w_{j, L(k)}^T(k)$ |, that minimize the magnitude of the error in the estimated encoding function:

$$\min_{w_{j,L(k)}(k)} \|\epsilon_{j,L(k)}^T(k)\| = \min_{w_{j,L(k)}(k)} \|w_{j,L(k)}^T(k) E_{L(k)} - e_j^T(k)\|. \quad (17)$$

For it to be possible to use Eq. 17 directly to find the optimal weights, the encoding vectors would need to be known, implying that the coil sensitivities would also need to be known. Local projection calibration does not use Eq. 17 directly. Instead, it provides a way to find near optimal local weights without needing to know the encoding vectors.

Local projection calibration takes advantage of the fact that linear combination weights which are found in one region of k-space can be applied in a completely different region. The reason such an approach works is because the element-by-element magnitude of the error in the estimated encoding vector, $|\epsilon_{j, L(k)}(k)|$, which we refer to as the magnitude image of the error in the estimated encoding vector, does not change when the encoding vector location and its neighborhood is shifted in k-space from position k to position k'. This can be shown by noting that shifting an encoding vector in k-space is equivalent to multiplying the vector by a gradient encoding term, allowing us to write $e_j(k') = e_j(k) \cdot g(k'-k)$. Since $\epsilon_{j, L(k)}(k)$ is a linear combination of encoding vectors, the shifted error vector can be written as $\epsilon_{j, L(k)}(k) \cdot g(k'-k)$. Finally, since $$g^*(k, r) g(k, r) = \exp(i2\pi k^T r) \exp(-i2\pi k^T r) = 1 \; |\epsilon_{j,}$$
$$_{L(k)}(k) \cdot g(k'-k)| = |\epsilon_{j, L(k)}(k)|. \quad (18)$$

Alternatively, one can recognize that a shift in k-space is equivalent to applying a linear phase shift to the image-space vector $\in_{j, L(k)}(k)$, which does not affect the magnitude of any element.

Because shifting in k-space does not affect the magnitude of an image-space vector, the same weights that minimize the magnitude of the shifted error vector will minimize the magnitude of the original error vector. Thus, what matters in determining the weights is not where the encoding vectors are in k-space, but the pattern they form relative to the k-space location of the encoding vector being synthesized. To take advantage of the ability to freely shift in k-space, the pattern set is defined as $$P(k,k') = \{(j, k'+\Delta k) | (j, k+\Delta k) \in L(k)\}, | \quad (19)$$

which takes the pattern of acquired locations around location k and centers them around location k'. Illustrations of A, L(k) and P(k, k') are given in FIG. 1. Using the pattern set, a modification of Eq. 16 can be written, in which all of the encoding vectors have been shifted in k-space from position k to position k':

$$\hat{e}_{j, P(k,k')}^T(k') = w_{j, L(k)}^T(k) E_{P(k,k')}. \quad (20)$$

Equation 20 expresses the estimate of the encoding function at location (j, k') from encoding functions in the local neighborhood of k' that are of the same pattern as the acquired encoding functions are about k. The error in the estimated encoding vector in Eq. 20 can be written as $$\epsilon_{j, P(k,k')}(k') = \hat{e}_{j, P(k,k')}(k') - e_j(k') \quad (21)$$
$$= [\hat{e}_{j, L(k)}(k) - e_j(k)] \cdot g(k' - k) \quad (22)$$
$$= \epsilon_{j, L(k)}(k) \cdot g(k' - k). \quad (23)$$

Thus, using the pattern set, Eq. 18 can be written as $$|\epsilon_{j, P(k,k')}(k')| = |\epsilon_{j, L(k)}(k)|. \quad (24)$$

Note that both Eq. 16 and Eq. 20 use the same set of weights, $W_{j, L(k)}(k)$, to calculate the estimated encoding vector. When the same weights are used, Eq. 24 shows that the magnitude images of the error vectors for both encoding vectors are the same.

Without knowing the coil sensitivities, no encoding vectors are known, so we cannot find the linear combination weights using Eq. 17. However, we do have sufficiently sampled data within the low spatial frequency central region of k-space and this data can be used to generate the linear combination weights.

Figure 2:
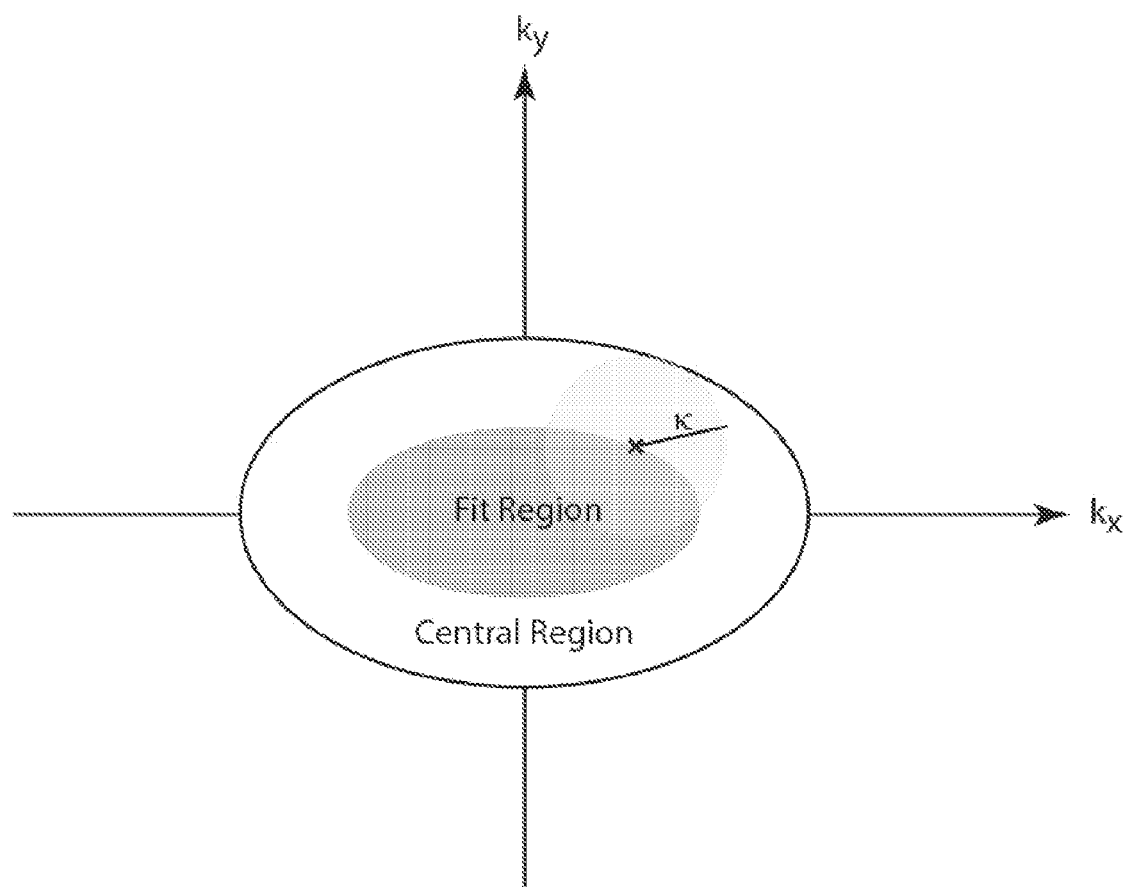
FIG. 2 illustrates the central region is the region within which all possible $d_j(k)$ are known, the central region is the region inside of the central region, with a margin of κ, the radius of the pattern set.

All of the data used to find the linear combination weights comes from the so-called central region of k-space. That is, local projection calibration assumes that there is a region, called the central region, where $d_j(k)$ is known, or can be found, for all encoding locations (j, k) as long as is within the central region. In addition to the central region, we define the central region as a region within the central region as shown in FIG. 2. The central region is important because for any location k within the central region, the pattern set P(k, k') will always be in the central region.

Local projection calibration determines the local weights by minimizing $$\|w_{j, L(k)}^T(k) [d_{P(k,k'_1)} \ldots d_{P(k,k'_N)}] - [d_j(k'_1) \ldots d_j(k'_N)]\|, \quad (25)$$

where $k'_1 \ldots k'_N$ denote N k-space locations that fall on a full-FOV Cartesian grid in the central region and $d_{P(k,k')}$ contains data at the locations in P(k,k'). We will develop more insight into the choice of k'$_1$ ... k'$_N$ shortly, as we analyze Eq. 25. The weights can be computed directly as $$w_{j, \mathcal{L}_{(k)}}^T(k) = [d_j(k'_1) \ldots d_j(k'_N)][d_{P(k,k'_1)} \ldots d_{P(k,k'_N)}]^\dagger, \quad (26)$$

While Eq. 26 shows how the local projection calibration technique finds linear combination weights using data from the central region, it does not give much information on the properties of these weights. We now take advantage of the notation we have developed to demonstrate that the weights found by minimizing Eq. 25 will minimize the error in the estimated encoding vector weighted by the magnetization. That the minimization is performed on the magnetization-weighted error in the estimated encoding vector and not on the unweighted error in the estimated encoding vector is to some degree unavoidable. However, this weighting is not undesirable, the estimated encoding vector will tend to be more accurate where there are large amounts of magnetization. Errors in the estimated encoding vectors at locations where there are amounts of magnetization can result in large errors in the synthesized data values, so especially important that the estimated encoding vectors be accurate at these locations.

To demonstrate that such a minimization is, in fact, accomplished by local projection calibration, we start by looking at the data estimation error for a k-space location k', within the central region and expanding each data value in terms of its encoding vector and the magnetization, $$d_j(k) = e_j^T(k)m \text{ and } d_{P(k,k')} = E_{P(k,k')}m.$$

$$w_{j,\mathcal{L}(k)}^T(k)d_{P(k,k')} - d_j(k') = w_{j,\mathcal{L}(k)}^T(k)E_{P(k,k')}m - e_j^T(k')m \quad (27)$$

$$= \hat{e}_{j,P(k,k')}^T(k')m - e_j^T(k')m \quad (28)$$

$$= \epsilon_{j,P(k,k')}^T(k')m \quad (29)$$

$$= g^T(k')[\epsilon_{j,P(k,0)}(0) \cdot m]. \quad (30)$$

The expression $g^T(k')[\epsilon_{j,P(k,0)}(0) \cdot m]$ can be interpreted in a very natural way. First of all, note that $\epsilon_{j,P(k,0)}(0)$ is a special case; since $e_j(0)=s_j$, the sensitivity of coil j, $\hat{e}_{j,P(k,0)}(0)$ is an estimate of the sensitivity of coil j and $\epsilon_{j,P(k,0)}(0)$ is the error in that estimate. $\epsilon_{j,P(k,0)}(0) \cdot m$ is then the sensitivity estimation error weighted by the magnetization. Finally, multiplication by $g^T(k')$ computes the discrete space Fourier transform of the weighted sensitivity estimation error, evaluated at k'.

In Eq. 25, the magnitude is taken of a vector, each element of which contains the data estimation error, $w_{j, \mathcal{L}_{(k)}}^T(k) d_{P(k,k')} - d_j(k')$, for one of the k' locations in k'$_1$ ... k'$_N$. Expressing the data estimation error for each k-space location, k'$_1$ ... k'$_N$, as a sample of the discrete space Fourier transform of the sensitivity estimation error weighted by the magnetization, as in Eq. 30, Eq. 25 can be written as the magnitude of the discrete space Fourier transform of the magnetization-weighted sensitivity estimation error, sampled at the low spatial frequency locations k'$_1$ ... k'$_N$:

$$\left\| DSFT\{\epsilon_{j,P(k,0)}(0) \cdot m\}(k) \sum_{i=1}^N \delta(k'_i - k) \right\|. \quad (31)$$

Since Eq. 25 is mathematically equivalent to Eq. 31, the weights that minimize Eq. 25 will also be the weights that minimize Eq. 31. Thus, the weights obtained using local projection calibration minimize the low frequency components of the magnetization-weighted sensitivity estimation error. Since the majority of the energy of the magnetization and sensitivity functions is contained in their low frequency components, local projection calibration will tend to find weights that successfully minimize the overall magnetization-weighted sensitivity estimation error.

By setting k=0 in Eq. 24, we see that the magnitude image of the sensitivity estimation error is equivalent to the magnitude image of the error in the estimated encoding vector used to synthesize the datum at location k:

$$|\epsilon_{j,P(k,0)}(0)| = |\epsilon_{j, \mathcal{L}_{(k)}}(k)| \quad (32)$$

Thus, the magnetization-weighted sensitivity estimation error is equal to the magnetization-weighted error in the estimated encoding vector, $$\|\epsilon_{j,P(k,0)}(0) \cdot m\| = \|\epsilon_{j, \mathcal{L}_{(k)}}(k) \cdot m\| \quad (33)$$

and minimizing the magnetization-weighted sensitivity estimation error is equivalent to minimizing the magnetization-weighted error in the estimated encoding vector.

Equation 31 also provides some insight into the choice of k'$_1$ ... k'$_N$. By choosing k'$_1$ ... k'$_N$ to cover a full-FOV grid in the central region, we ensure that all of the low frequency components of the magnetization-weighted sensitivity estimation error are included in the minimization. Choosing the extent of the central region in k-space is still an inexact art, depending to some degree on the energy distribution in k-space of the magnetization and coil sensitivities. However, by choosing N to be much larger than the total number of elements in the local set, L(k), the error in the estimated encoding vector will be determined more by the ability of the local encoding vectors, $E_{L(k)}$, to synthesize the estimated encoding vector than by the effect the extent of the central region has on the calculation of the weight values.

Figure 3B:
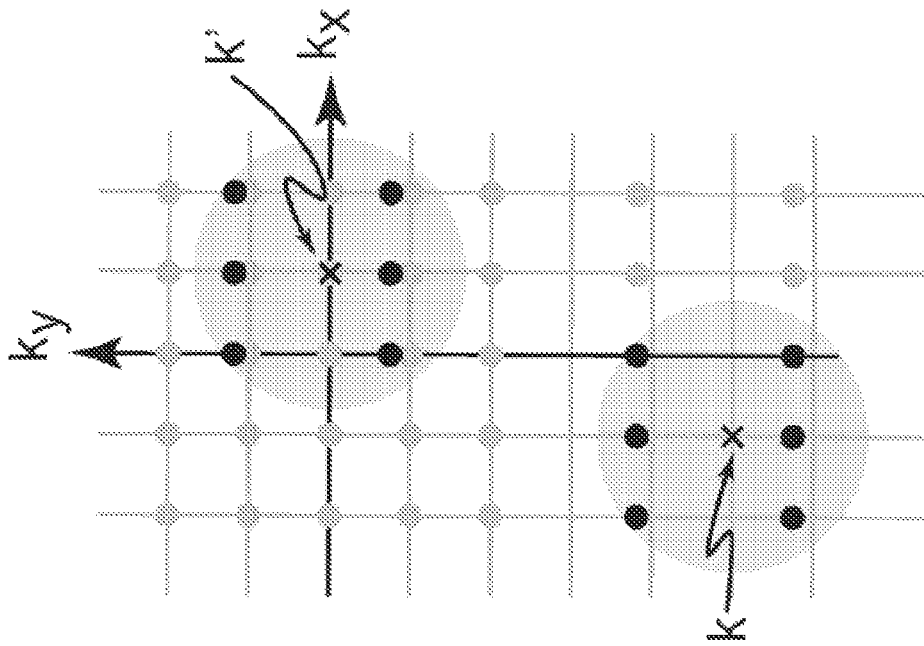
FIG. 3b when a non-uniform sampling trajectory is used, P(k, k') is not contained in the acquisition set A and data at the locations in P(k, k' must be synthesized.
Figure 3A:
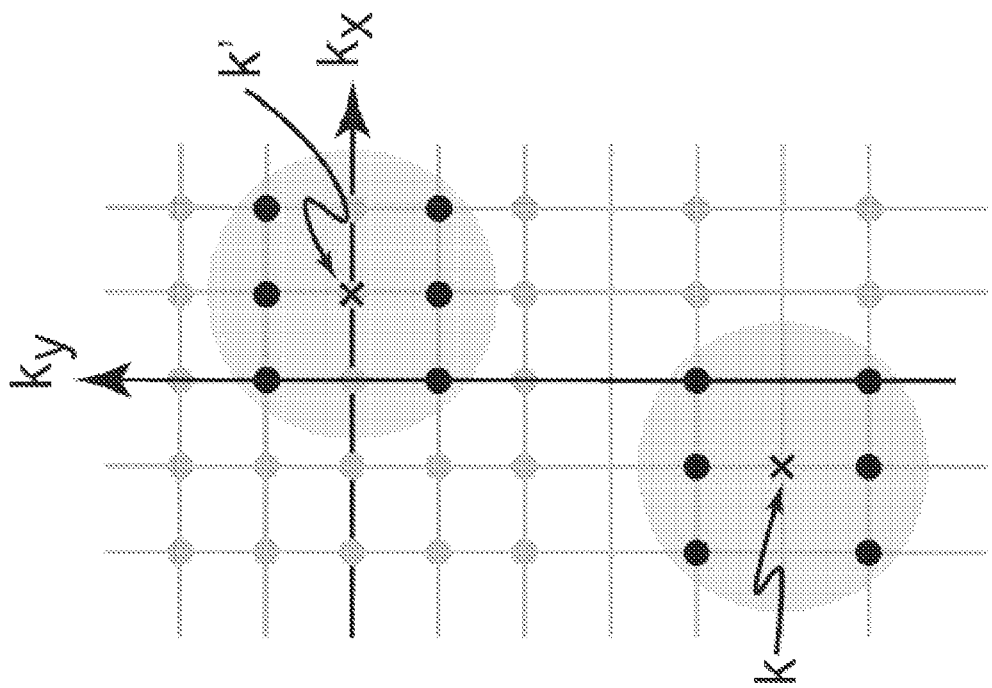
FIG. 3a illustrates when data is acquired on a uniform Cartesian grid, it is possible to choose the k' such that the pattern set P(k, k') is contained in the acquisition set A and in this case, no interpolation within the central region is required to perform local projection calibration.

In the above analysis of local projection calibration, it was shown that high quality local weights can be found without knowing the coil sensitivities, assuming all data values are known, or can be found, within the central region. While interpolation might be necessary when required points have not been acquired directly, when all of the acquired data falls on a uniform Cartesian grid, acquiring data at all grid locations in the central region is sufficient for local projection calibration. As shown in FIG. 3(a), this is because the full-FOV grid can be chosen such that the encoding locations (j, k'$_1$). (j, k'$_N$) are contained in the acquisition set A. The auto-calibration technique used by Cartesian GRAPPA is a practical implementation of local projection calibration that takes advantage of this special case. However, to use local projection calibration for arbitrary k-space trajectories, we must find a practical way for dealing with the reality that we will not have acquired data for every location in the central region. In the next section, we show how APPEAR uses an interpolation scheme to deal with this problem.

Central Region Interpolation: When data is acquired using a k-space sampling pattern that does not fall on a uniform Cartesian grid, local projection calibration cannot be used directly since it requires data values from locations in the central region that have not been acquired, as shown in FIG. 3(b). To overcome this problem, the APPEAR method synthesizes data values in the central region from the acquired data. By being able to synthesize any value in the central region, APPEAR is able to take full advantage of the local projection calibration technique.

Figure 4:
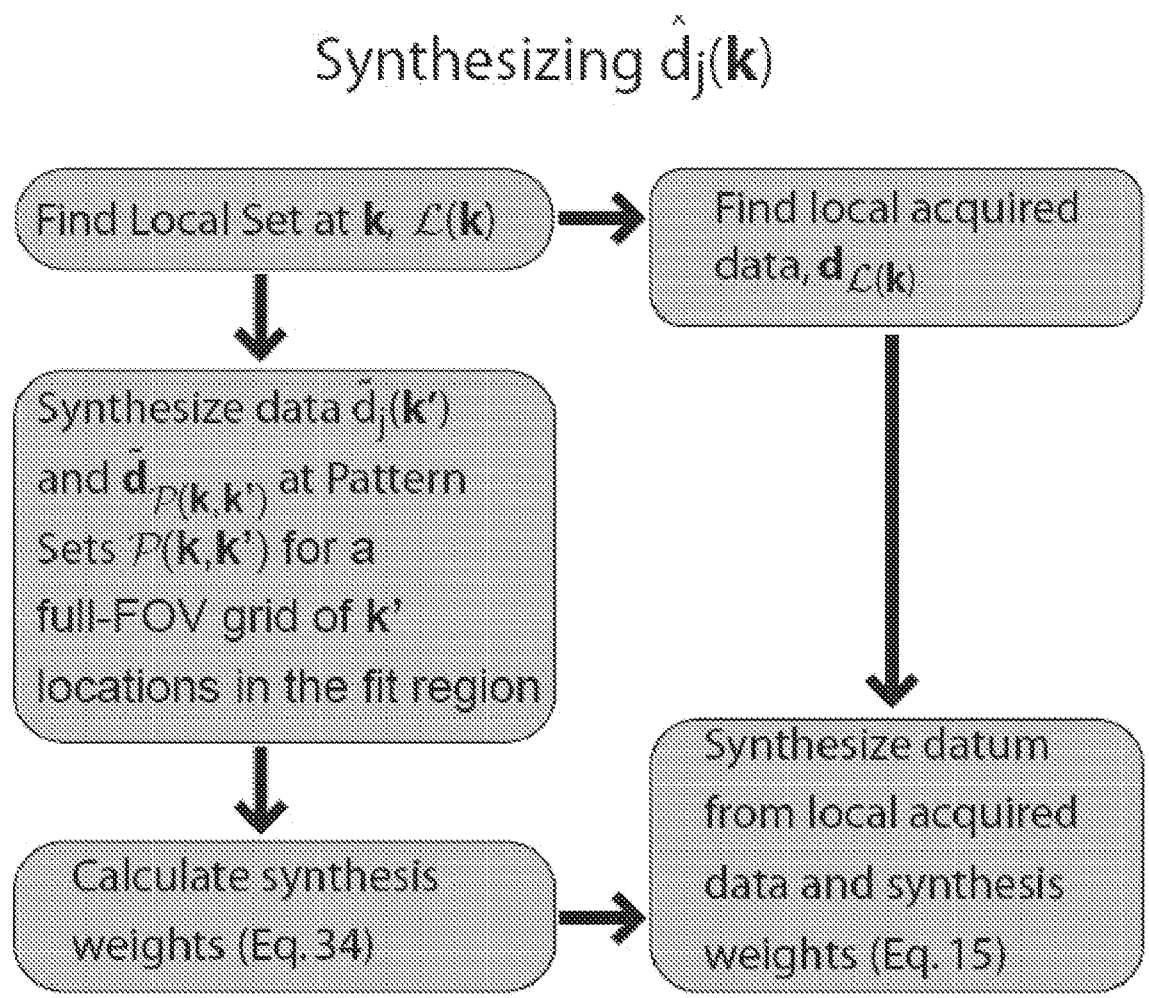
FIG. 4 illustrates the APPEAR procedure for synthesizing an unacquired datum at location k outside of the central region.

Before engaging the details of central region interpolation, we summarize the overall APPEAR procedure. As illustrated in FIG. 4, for each point on the k-space grid to be synthesized, APPEAR determines the local pattern of acquired data and then synthesizes data in that pattern at locations across a full-FOV grid in the central region. In the central region, a synthesized datum is denoted by ḋⱼ(k), differentiating it from the synthesized datum value d̂ⱼ(k). Whereas d̂ⱼ(k) is synthesized from data from all coils in regions where the gradient encoding does not sufficiently encode for the FOV, ḋⱼ(k) is synthesized only from coil j data in the central region, where the gradient encoding does sufficiently encode for the FOV. The data values synthesized at the locations in P(k, k') can be assembled into a vector, denoted by ḋ$_P$(k,k'). The weights can then be calculated as $$w_{j, L_{(k)}}^T(k) = [\check{d}_j(k'_1) \ldots \check{d}_j(k'_N)][\check{d}_{P(k,k'_1)} \ldots \check{d}_{P(k,k'_N)}]^\dagger, \quad (34)$$

which is identical to Eq. 26, except that the data values are synthesized. Using Eq. 34, APPEAR determines a separate set of weights for each grid point to be synthesized, repeating the procedure illustrated in FIG. 4, to synthesize data at all of the grid points outside of the central region.

The success of the APPEAR method rests heavily on the ability to synthesize data values within the central region of a coil's k-space using only the data acquired on that receiver coil. Techniques, such as gridding, and BURS, for synthesizing data in new k-space locations from a set of full-FOV data are commonly used for reconstructing non-Cartesian k-space sampling patterns acquired using only one coil. However, these methods are designed to minimize errors in a particular FOV in image space, whereas the synthesis method used by APPEAR needs to minimize errors in the low spatial frequency region of k-space. This is a subtle but important difference. For example, when gridding is performed on an oversampled grid, errors can be pushed outside of the FOV of the object, separating the errors from the object. However, these errors cannot be separated from the data in such a clean fashion in k-space. We now develop the procedure that APPEAR uses to get high quality synthesized data suitable for use with the local projection calibration technique.

The single-coil data synthesis problem can be formulated in a similar way to the multi-coil formulation. However, in the single-coil case, the unknown coil sensitivity is grouped with the magnetization by letting $m_s$ denote the sensitivity-weighted magnetization, described in Table IV. Since only one coil is being considered at a time, the coil index j has been dropped. The analysis of the sensitivity-weighted magnetization is done by gradient encoding, such that $d(k)=g^T(k)m_s$. Similar to the multi-coil case, we can synthesize an encoding function from acquired encoding functions in the local k-space neighborhood, but in this case the encoding is solely accomplished by the gradients. The single coil version of Eq. 16 can be written as $$\hat{g}_{C(k)}^T(k) = w_{j,C(k)}^T(k)G_{C(k)}, \quad (35)$$

where C(k) is the k-space kernel set $$C(k) = \{k+\Delta k | d_j(k+\Delta k) \text{ was acquired}, \|\Delta k\|<k\} \quad (36)$$

and $G_{C(k)}$ is the gradient encoding matrix, each row of which contains a gradient encoding vector whose location is in the kernel set. The estimated gradient encoding vector is denoted by $\hat{g}_{C(k)}(k)$ and the linear combination weights, $w_{jC(k)}(k)$, can be found as the weights that minimize the magnitude of the error in the estimated gradient encoding vector:

$$\min_{w_{j,C(k)}(k)} \|\hat{g}_{C(k)}^T(k) - g^T(k)\| = \min_{w_{j,C(k)}(k)} \|w_{j,C(k)}^T(k)G_{C(k)} - g^T(k)\|. \quad (37)$$

Unlike the multi-coil case where the encoding vectors are not known, in the single coil case the gradient encoding vectors are known and the weights can be found directly by minimizing Eq. 37.

Figure 5A:
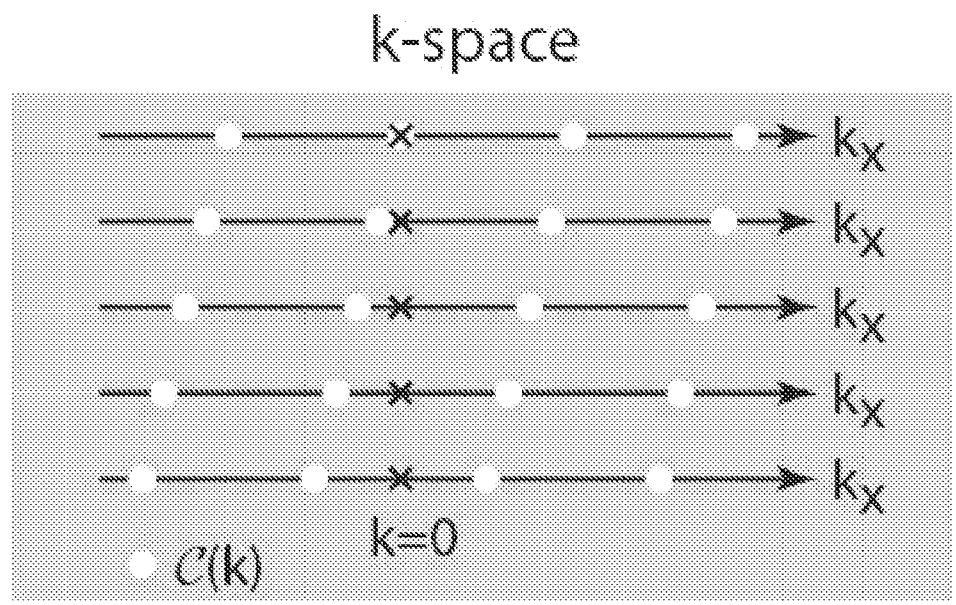
FIGS. 5a-5c illustrates oversampling and apodization can greatly increase the accuracy of synthesized data values in the central region. In this 1D illustration, gradient encoding vectors at four acquired locations are used to synthesize the gradient encoding vector at $k_x=0$.
Figure 5B:
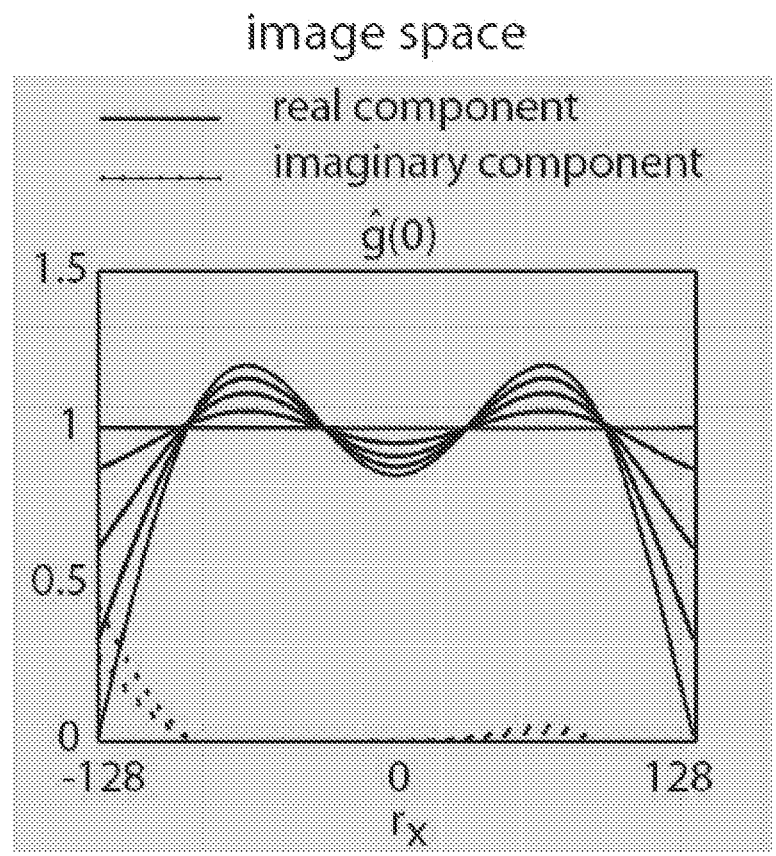

While such a procedure finds the optimal weights for estimating g(k) from its surrounding neighborhood, this estimate still is not of high enough accuracy when using a small number of points. To illustrate this, we use a one dimensional example, showing the accuracy that can be expected from this approach. Five different attempts are made to synthesize g(0), which equals unity, from four local gradient encoding vectors. In each of the five attempts, the four local gradient encoding vectors are shifted slightly in relation to g(0), as shown in FIG. 5(a). For each attempt, we find the optimal weights by minimizing Eq. 37 and use these weights in Eq. 35 to find the estimated gradient encoding vector. These five estimated encoding vectors are plotted in FIG. 5(b). In the first attempt, where one of the local gradient encoding vectors is at location k=0, ĝ(k) is unity throughout. However, as the local gradient encoding vectors get shifted, the synthesis degrades. In the last attempt, where g(0) is midway between two local gradient encoding vectors, the edges of the estimated encoding vector are close to zero.

The accuracy of the data synthesis can be greatly increased using oversampling and apodization. While both of these concepts are used in gridding, they must be applied in a slightly different way in this case. Instead of depositing the data on an oversampling grid, in this case oversampling is accomplished by acquiring data in the central region more closely together (spaced for a larger FOV than the FOV of the object). Currently an oversampling ratio of 1.5 is used, which has been shown to give high accuracy in gridding. APPEAR takes advantage of apodization by finding the weights that synthesize an apodized version of the gradient encoding vector instead of the gradient encoding vector itself. By synthesizing all of the data in the central region using similarly apodized versions of the gradient encoding vectors, the resultant data, edj(k), is equivalent to data obtained by encoding an apodized version of the sensitivity weighted magnetization with the non-apodized gradient encoding vectors.

Figure 5C:
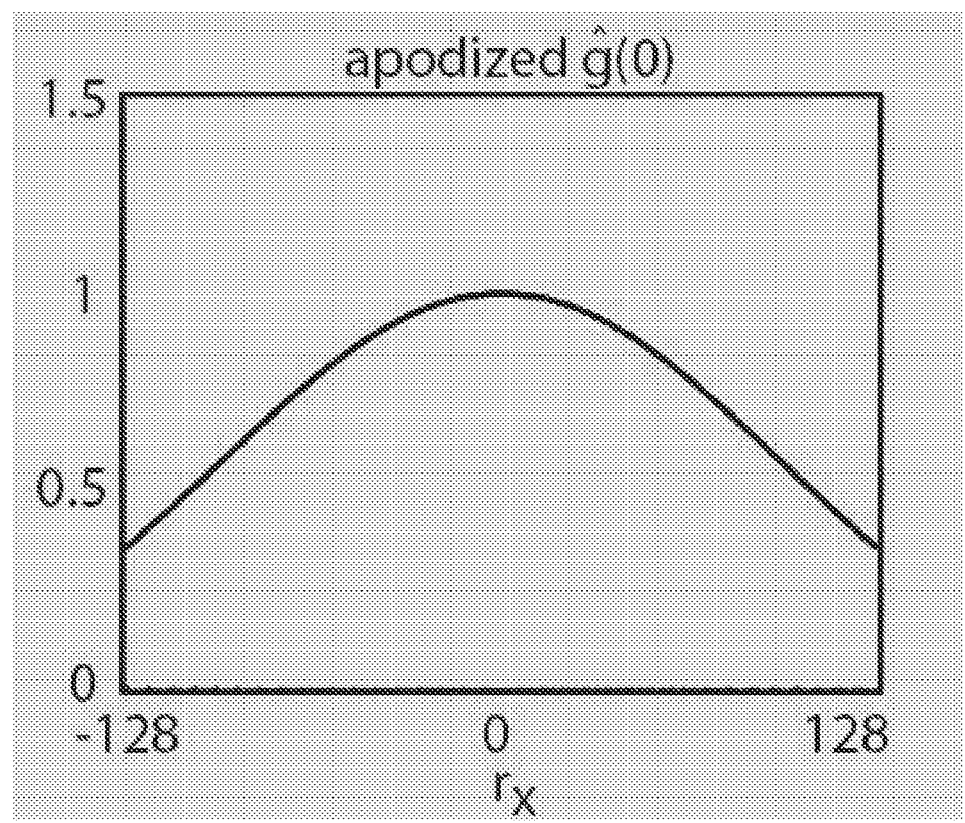

FIG. 5(c) shows that using oversampling and apodization lead to a dramatic improvement in the fidelity of the synthesized data. In FIG. 5(c), all five apodized estimated gradient encoding vectors and the target apodization function overlap, appearing as one curve.

Figure 6:
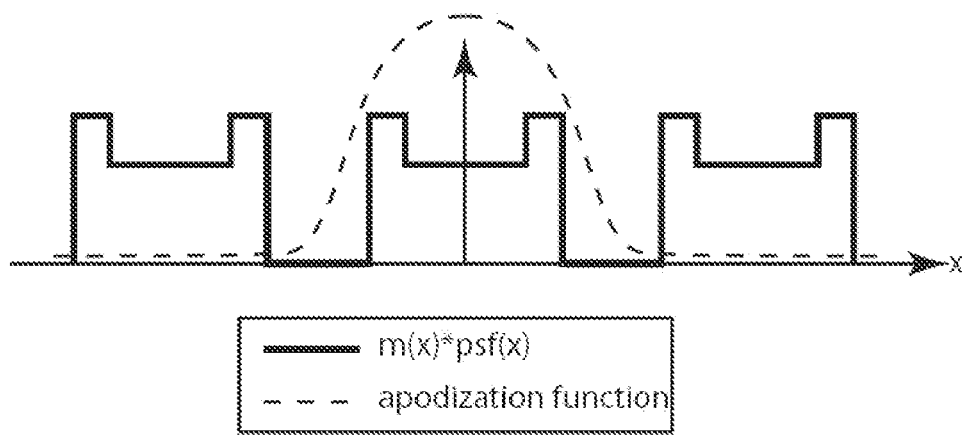
FIG. 6 illustrates an image space illustration of how oversampling and apodization allow high quality synthesis of the apodized magnetization when the samples in the central region are uniformly spaced. Oversampling the central region pushes the image repetitions further away, allowing for a transition band. The apodization function (the Fourier transform of the girding kernel) then suppresses the image repetitions. Unlike gridding, in k-space interpolation, m (r) * psf(r) must be zero (or sufficiently close to zero) in the transition band.

In a case such as the example in FIG. 5, where the samples in the central region are uniformly spaced, finding the weights that central to an apodized version of the gradient encoding vector can be accomplished by convolving the acquired data with an appropriate gridding kernel and sampling at the unacquired location. Thus, the result shown in FIG. 5(c) can be realized by using a Kaiser-Bessel window with shape parameter β=7.9, chosen for an oversampling ratio of 1.5 and a kernel width of 4. In this case, the apodization will be equivalent to the Fourier transform of the gridding kernel. FIG. 6 shows an image space picture illustrating how oversampling and apodization allow for highly accurate synthesis from uniformly spaced samples. When the samples in the central region are not uniformly spaced, the gridding approach cannot be expected to find the optimal weights, however it is possible that for some k-space trajectories such as radial and spiral, gridding with density compensation might give sufficient accuracy. While a gridding approach is computationally attractive, the weights can alternatively be found directly by solving for the weights that minimize the error in the estimated apodized gradient encoding function:

$$\min_{w_{j,C(k)}(k)} \|w_{j,C(k)}^T(k) G_{C(k)} - g_a^T(k)\| \quad (38)$$

where $g_a(k) = a \cdot g(k)$ for apodization vector a. This approach is attractive because it will find the optimal weights for any given kernel set, C(k), as long as it is sufficiently oversampled for the FOV.

When centralting to an apodized gradient encoding function, the synthesized data in the central region is equivalent to data that would be obtained with the same coil sensitivity but with a magnetization that is an apodized version of the actual magnetization. Thus, instead of the local projection calibration technique minimizing the encoding estimate error weighted by the magnetization, in the APPEAR case it minimizes the encoding estimate error weighted by an apodized version of the magnetization. Because of this, we must be careful not to allow too severe of an apodization, which can reduce the quality of the estimated encoding vector toward the edges of the FOV. In all experiments to date, the apodization function used (Fourier transform of a Kaiser-Bessel window) performs very well.

By slightly oversampling in the central region and synthesizing data that would be generated from an apodized version of the magnetization, instead of insisting on synthesis of data that would be acquired by the scanner, we are able to provide the local projection calibration technique with data values at any location in the central region, as required by the local projection calibration technique. In doing so, APPEAR gives a practical implementation of local projection calibration for arbitrary k-space trajectories.

Noise in the acquired data samples affects APPEAR in two ways. Firstly, noise in the central region can degrade the quality of the synthesis weights thereby increasing the error in the estimated encoding vector. Since errors in the estimated encoding vector can manifest themselves as structured image artifacts, it is important that the data acquired in the central region have a sufficiently high signal-to-noise ratio to ensure that the estimated encoding vector is accurate. Secondly, noise in the data samples leads to noise in the reconstructed image. Similar to other multi-coil reconstruction methods, the noise level varies from voxel to voxel. Since APPEAR is non-iterative, the noise level at each voxel can be calculated in a straightforward manner from the receiver noise matrix and the synthesis weights, as shown in the appendix.

Figure 7A:
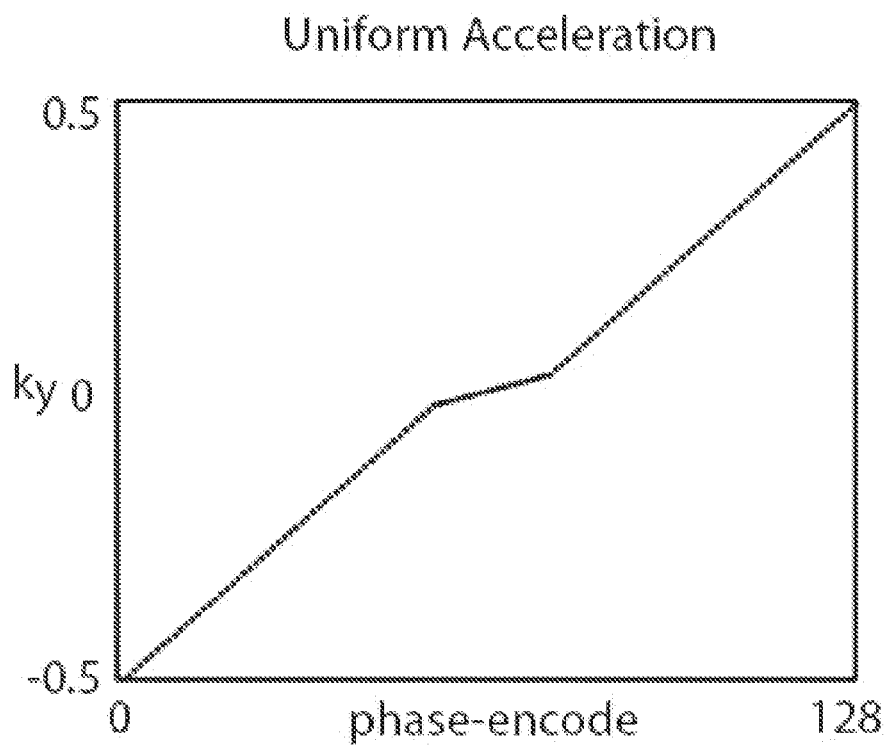
FIG. 7a illustrates phase-encode locations for trajectory with uniform acceleration outside of the central region.
Figure 7B:
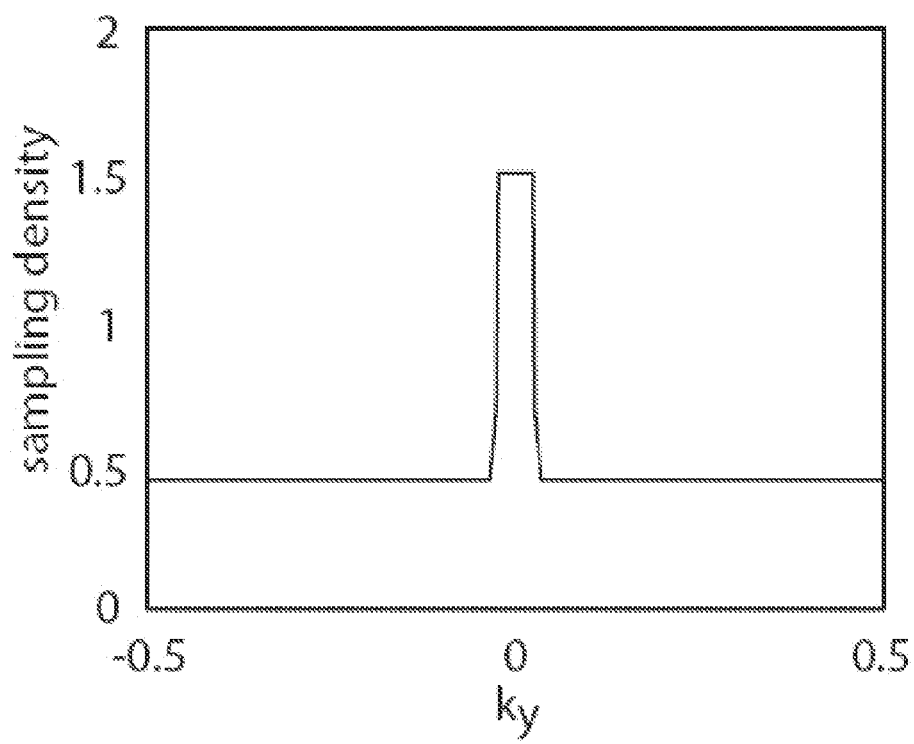

Numerical simulations were performed in Matlab (MathWorks, Natick, Mass.) using a Shepp-Logan phantom and the same coil architecture used for the numerical simulations in [18]. The k-space trajectory used, shown in FIG. 7(a), consisted of 128 phase-encode lines, the central 20 lines spaced with an oversampling ratio of 1.5. The remaining 108 lines were uniformly spaced, giving a constant acceleration of 2.25 in the high spatial frequency region. As a full-FOV dataset for equivalent k-space coverage would require 256 phase-encode lines, the net acceleration was 2. Reconstructions were performed using PARS and APPEAR with local radius, K=4/FOV.

Figure 7C:
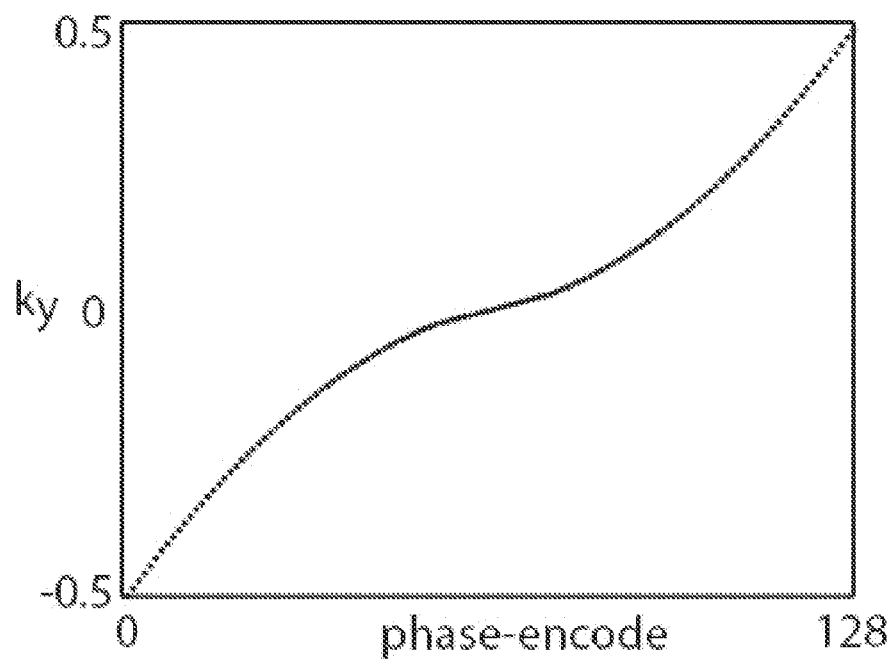
FIG. 7c illustrates phase-encode locations for trajectory with variable acceleration outside of the central region.
Figure 7D:
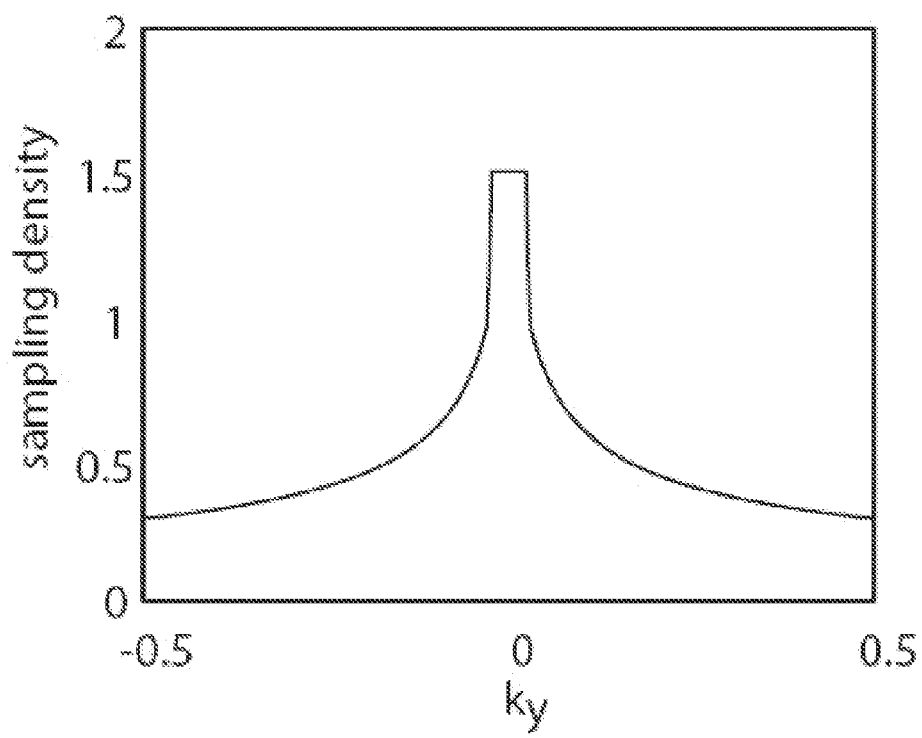
FIG. 7d illustrates sampling density of the trajectory in FIG. 7c.

Scanner experiments were performed on a 1.5T GE Excite scanner using two k-space trajectories: the trajectory used in the numerical simulations and a non-uniformly spaced trajectory. The non-uniformly spaced trajectory was identical to the uniformly spaced trajectory except that the 108 high spatial frequency phase-encodes were non-uniformly spaced, giving an acceleration ranging from 1 to 3.5, as seen in FIG. 7(c). A standard GRASS sequence was used for all scans.

The first experiment consisted of scanning an axial slice of a ball phantom using an 8-channel high-resolution knee coil (MRI Devices Corp., Waukesha, Wis.). In this experiment, the frequency encoding was done in the A/P direction. The second experiment consisted of scanning an axial slice of the brain of a healthy volunteer using an 8-channel high-resolution head coil (MRI Devices Corp., Waukesha Wis.). In this experiment, the frequency encoding was done in the R/L direction. A 5 mm slice was excited for both experiments. The ball was scanned with a TE/TR of 10/1000 and an 11 cm FOV. The brain was scanned with a TE/TR of 10/50 and a 22 cm FOV. The data was reconstructed using PARS, APPEAR and by separately gridding the data from each coil followed by a sum-of-squares combination.

Figure 8A:
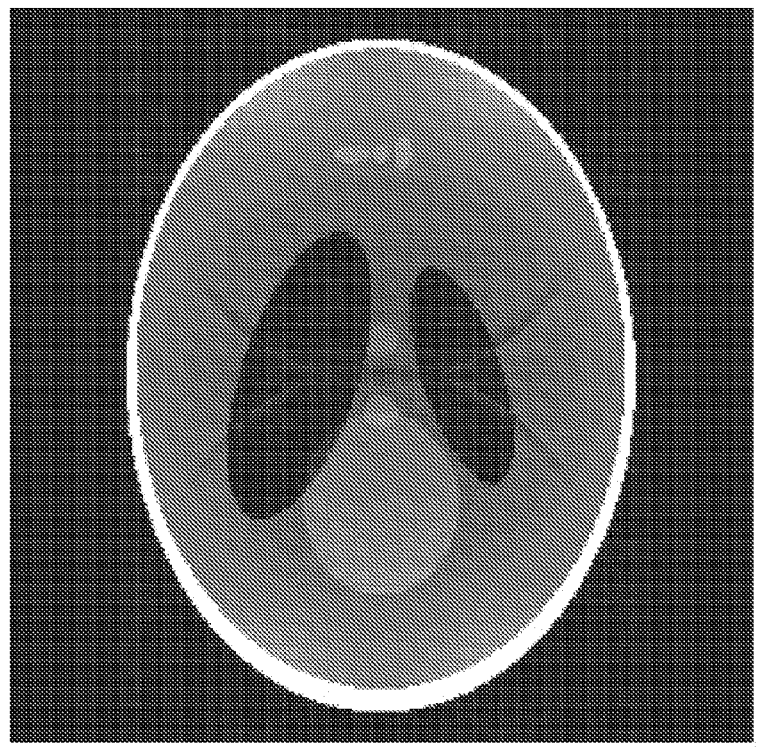
FIGS. 8a-8b illustrates.
Figure 8B:
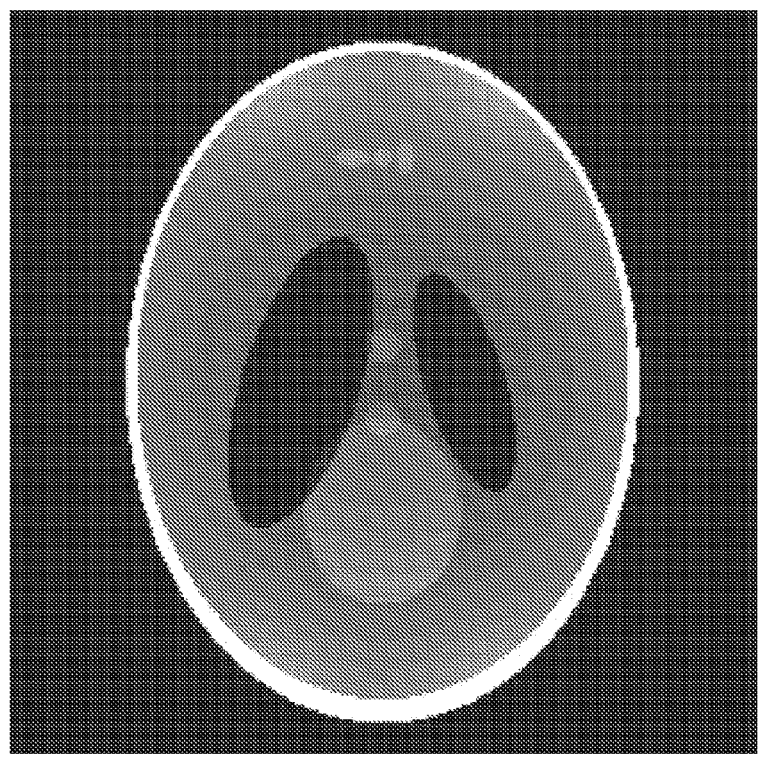

The results for the numerical simulations are shown in FIG. 8. While the APPEAR method is able to remove the aliasing artifact, the PARS reconstruction still has visible aliasing artifact. Since the coil sensitivities are known in the case of the numerical phantom experiment, it is possible to calculate the error in the estimated encoding vector, $\in_{j, \mathcal{L}(k)}(k)|$, directly for a set of linear combination weights. The error vector, $\in_{j, \mathcal{L}(k)}(k)|$, can be viewed as an image, similar to the magnetization vector m. While the error vector images do not directly represent errors in the reconstructed images, they do indicate the accuracy with which unknown data values are synthesized. The error in a synthesized datum value can be found by multiplying the error vector image, corresponding to the encoding location of the synthesized datum, by the magnetization and summing the result. Thus, nonzero values $\in_{j, \mathcal{L}(k)}(k) |$ in where there is no magnetization are unimportant.

Figure 9A:
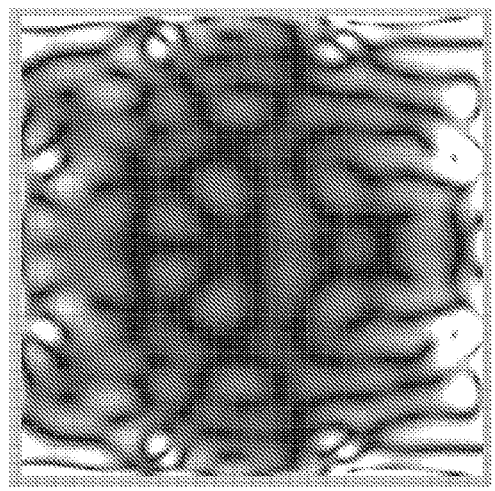
FIGS. 9a-9c illustrates the magnitude image of the error in the estimated encoding function $|\in_{j,L(k)}(k)|$, for a coil on the right-hand side of the image and the unacquired k-space location $k=[0,21.3/FOV]^T$, shown for three different methods of finding the linear combination weights.
Figure 9B:
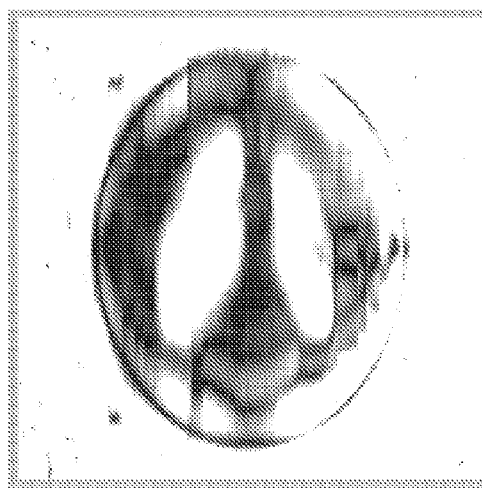
Figure 9C:
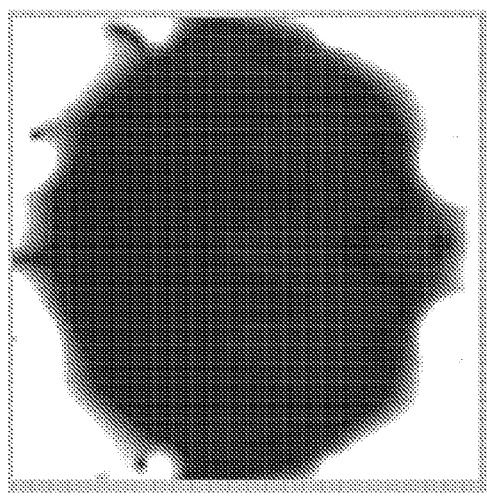

FIG. 9 compares the error in the estimated encoding vector, at one encoding location, obtained using the APPEAR weights to the error obtained using the PARS weights and to the error obtained using the weights found by directly from Eq. 17. In the region where there is magnetization, the error in the estimated encoding vector obtained using the PARS weights, where the coil sensitivities are estimated from low spatial frequency data, is significantly larger than the error obtained using the APPEAR weights. As well, since APPEAR only minimizes the error in locations where there is magnetization, it is able to do a better job of estimating the encoding function at locations where there is magnetization than a strict application of Eq. 17.

Figure 10:
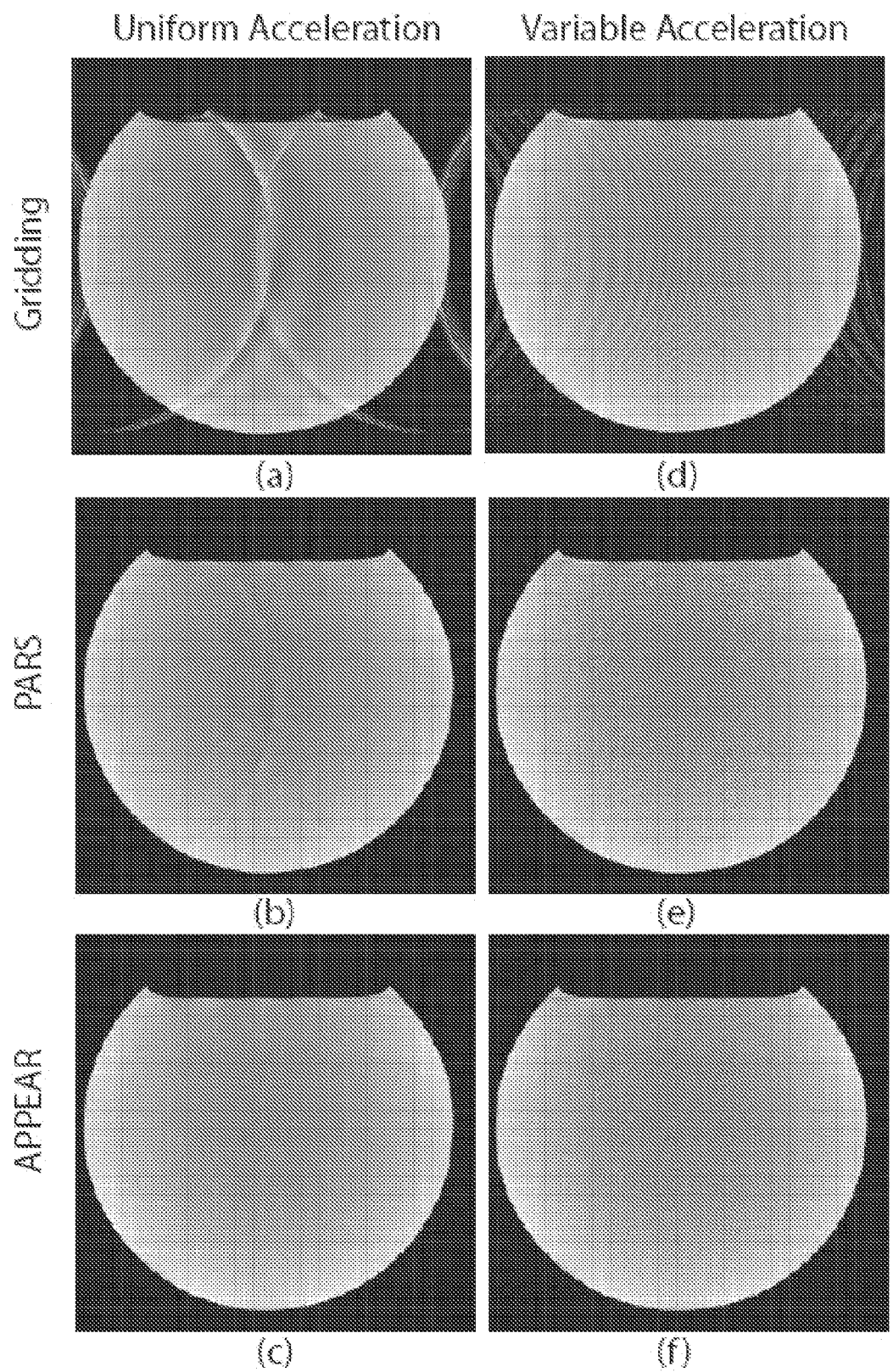
FIGS. 10a-f illustrates an axial slice of a ball phantom was scanned using an 8-channel high-resolution knee coil. Data was obtained using both trajectories shown in FIG. 7. In this experiment, the frequency encoding was done in the A/P direction.

The results of the phantom experiment are shown in FIG. 10. When the data from each coil is reconstructed separately by gridding, the aliasing artifacts due to sampling at a reduced FOV are evident. The variable acceleration trajectory reduces the structure of the aliasing artifact and spreads it throughout the image. Thus, while the PARS result for the uniform trajectory shows some residual artifact, the artifact is not noticeable for the PARS result with the variable acceleration trajectory. The cost of using a variable density trajectory is a reduction in the SNR efficiency. The local projection calibration technique used by APPEAR is able to remove the aliasing artifact for both trajectories.

Figure 11:
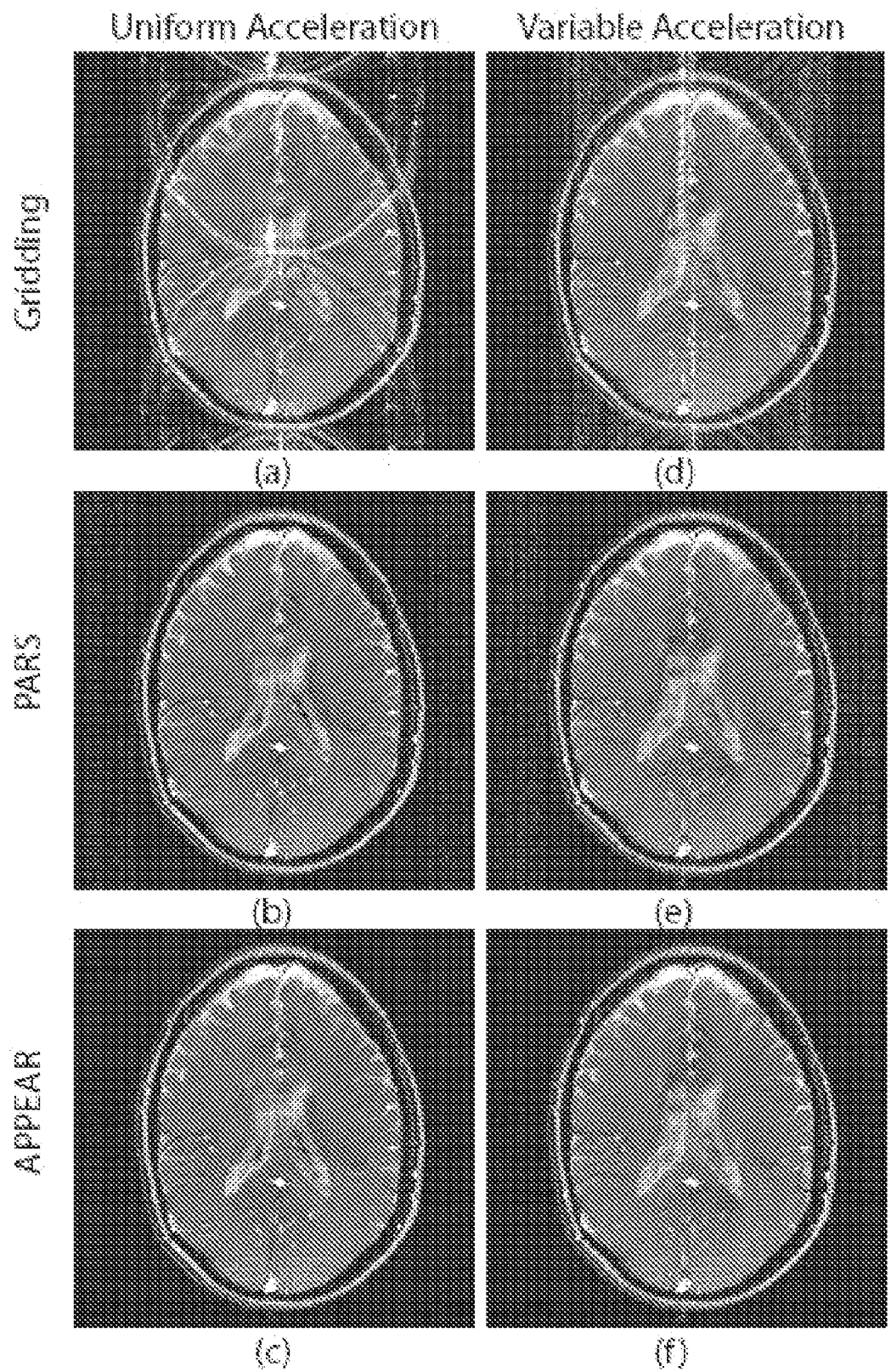
FIGS. 11a-f illustrates an axial brain slice was scanned using an 8-channel high-resolution head coil. Data was obtained using both trajectories shown in FIG. 7. In this experiment, the frequency encoding was done in the R/L direction.

FIG. 11 shows the in vivo results. Aliasing artifact is clearly visible in the gridding reconstructions and there is some aliasing of the skull into the middle of the image in the PARS reconstruction when the uniform acceleration trajectory is used. Once again, APPEAR is able to get rid of aliasing artifact for both trajectories.

As a method for reconstructing images from partially parallel encoded acquisitions, the APPEAR method performs well. In the experiments presented, APPEAR had significantly less artifact than the PARS method. The main difference between PARS and APPEAR is that APPEAR uses local projection calibration whereas PARS uses the self-calibration technique [6], in which data in the central region is used to estimate the coil sensitivities. Our results indicate that using the local projection calibration technique leads to less errors than using the self-calibration technique. To understand these results, it is instructive to look more closely at the self-calibration technique used by PARS. PARS finds the local weights that satisfy $$\min_{w_{j,\mathcal{L}(k)}(k)} \|w_{j,\mathcal{L}(k)}^T(k)E_{PARS,\mathcal{L}(k)} - e_{PARS,j}^T(k)\|, \quad (39)$$

which is similar to Eq. 17, except that $E_L(k)$ and $e_j^T(k)$ are replaced with $E_{PARS,(k)}$ and $e_{PARSj}^T(k)$. For the PARS encoding functions, the coil sensitivities are replaced with low resolution images reconstructed by inverse Fourier transform from the central region data. These images can be written as $[m(r)s_j(r)]*psf(r)$, where $psf(r)$ is the point-spread-function associated with the sampling pattern in the central region. The point-spread-function can be modified by applying different weightings to the k-space sampling locations. As described in [6], a Kaiser window weighting can be used to reduce the Gibbs ringing in the resultant image. Regardless of the weights chosen for the k-space sampling locations, convolution with $psf(r)$ makes it difficult to extract $s_j(r)$. Self-calibration is built on the approximation that $s_j(r)$ is very low frequency and $$[m(r)s_j(r)]*psf(r) \approx [m(r)*psf(r)]s_j(r), \quad (40)$$

which separates $s_j(r)$ from the other terms. Once $s_j(r)$ is separated in this way, coil-by-coil images can be reconstructed. The error in the approximation given in Eq. 40 tends to be largest near locations where $m(r)s_j(r)$ changes abruptly, such as at the edge of the object. These errors in turn lead to errors in the reconstruction matrix and estimated encoding functions. While local projection calibration limits itself to synthesizing estimated encoding functions from local neighborhoods, it is able to minimize Eq. 31 without approximation. Because of this, local projection calibration is not susceptible to errors due to the approximation in Eq. 40.

The autocalibration procedure used in Cartesian GRAPPA is a special case of local projection calibration, where the pattern sets needed to find the synthesis weights align perfectly with the acquired data in the central region. However, the extension of the autocalibration technique to radial and spiral trajectories, is not a case of local projection calibration. Autocalibration focuses on finding weights that optimize the central between raw unprocessed scanner-acquired data, but does not insist on the integrity of the pattern set. This is very different from local projection calibration which insists on the integrity of the pattern set, but accepts the use of synthesized (and apodized) data in finding the synthesis weights.

Figure 12:
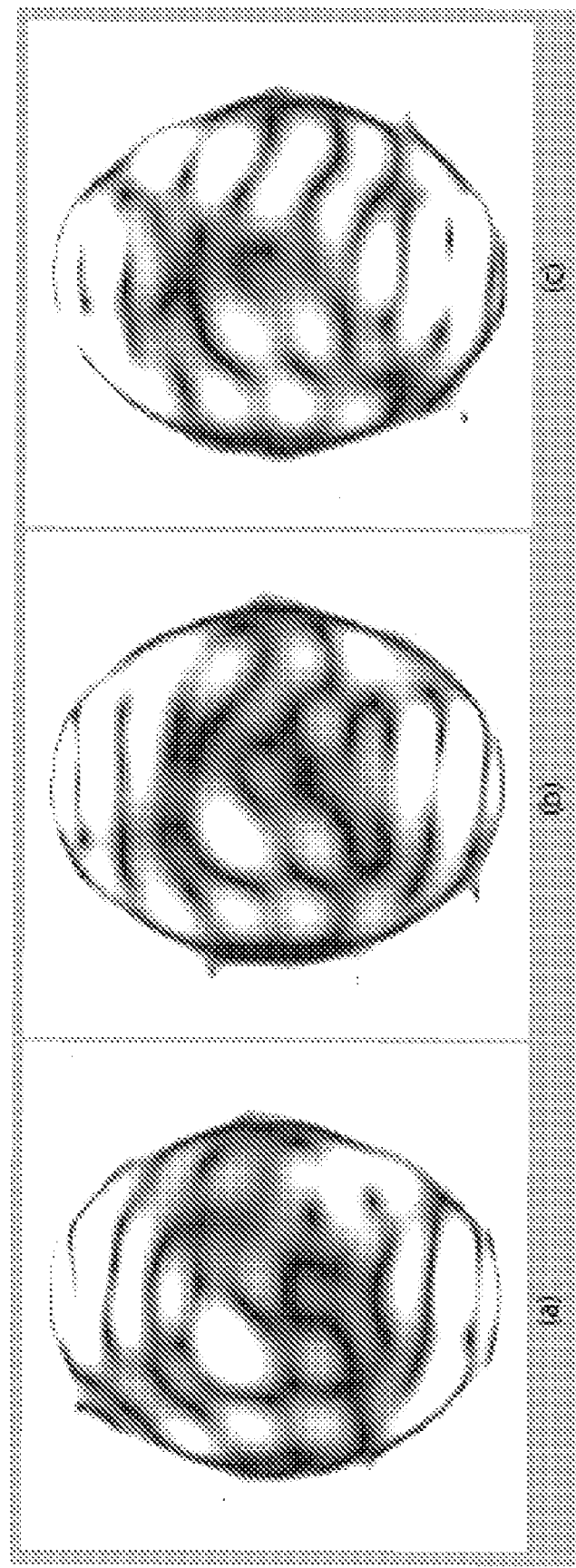
FIGS. 12a-c: Disregarding small rotational differences in pattern sets, the pattern set around location k=[0, 21.3/FOV]T (FIG. 9) is rotated continuously through 10° (−5 to 5°), creating a collection of pattern sets which only differ by a slight rotation. Data is collected from the central region for each of these pattern sets. Then, treating the collection of pattern sets as a common pattern set, the data is concatenated and weights are found (Eq. 26). The magnitude image of the error in the estimated encoding function is calculated and windowed, as in FIG. 9. Shown, the error in the estimated encoding function for the pattern set rotated.

When used for non-Cartesian trajectories, autocalibration has the difficulty that it is hard to find acquired data in the necessary patterns in the central region. In dealing with this difficulty, techniques that use autocalibration are forced to make a number of compromises. They no longer central a pattern throughout the central region, often being limited to centralting in a small section of the central region. They disregard small differences between pattern sets. For example, two pattern sets that differ by a small rotation or dilation might be treated as the same pattern set. Finally, they might need to acquire extra calibration data and perform centrals in high spatial frequency locations that have a significantly lower signal level than the signal level in the central region. In FIG. 12, it is shown that disregarding small differences between pattern sets degrades the quality of data synthesis. By using local projection calibration, APPEAR reconstructions are better able to remove aliasing artifacts. APPEAR has the additional advantage that it is not limited to specific non-Cartesian trajectories, but can easily work with arbitrary k-space trajectories.

APPEAR provides a great deal of freedom in choosing the k-space trajectory used to acquire the data. While the two trajectories used in this paper have the same number of phase-encodes and hence same net acceleration, they have different properties. The variable acceleration trajectory has worse SNR compared to the uniform acceleration trajectory, but is more robust to errors in the estimated encoding vectors and less likely to produce images with visible aliasing artifacts.

The APPEAR method is unique in requiring an oversampled region in the center of k-space. For some trajectories, such as the radial trajectory, where oversampling is inherent, this might not be a disadvantage. However, for many trajectories, this will require special attention in the trajectory design.

In this paper, we have focused on describing the APPEAR method and providing some preliminary results. As the method matures, we are exploring the tradeoffs in the choice of parameters, such as the extent of the local neighborhood and central region. In addition, since APPEAR finds a unique set of weights in order to synthesize each unacquired datum, it is a computationally intensive method; we are currently exploring ways to efficiently implement the APPEAR method for reduced gradient encoding in two and three dimensions.

It should also be noted that the utility of the APPEAR method is to reduce the encoding time necessary to acquire an image and as such, should only be employed when the encoding time needs to be reduced. Many scans are not limited by encoding time, but by the time required to obtain sufficient SNR. In this case, the APPEAR method is of limited utility. Indeed, the first use of multiple receiving coils in MRI was to increase SNR, not to reduce encoding time.

Still, there are many cases when it is advantageous to reduce the encoding time. For these cases, the results presented here indicate that APPEAR will provide high quality reconstructions. APPEAR is simple to use, since no coil sensitivities are needed and APPEAR is non-iterative. This simplicity does not limit the flexibility of APPEAR, which is able to reconstruct arbitrary k-space trajectories.

In conclusion, the theory behind local projection calibration has been derived. This theory shows that local projection calibration will attain near optimal linear combination weights for data synthesis, even though the coil sensitivities are not known. This theory also shows that there is a fundamental difference between local projection calibration and techniques which estimate coil sensitivities from low spatial frequency data. The results of this paper indicate that local projection calibration produces reconstructions with less aliasing artifact than reconstructions which use estimated coil sensitivities from low spatial frequency data.

The APPEAR method has been introduced as a way to take advantage of local projection calibration with arbitrary k-space trajectories. APPEAR is a straightforward method that does not require iteration. Preliminary experiments confirm that APPEAR is able to produce high quality reconstructions.

Attached are tables which identify variables and the functions as used herein.

While the invention has been described with reference to specific embodiments, the description is illustrative of the invention and is not to be construed as limiting the invention. Various modifications and applications may occur to those skilled in the art without departing from the spirit and scope of the invention as defined by the appended claims.

What is claimed is:

1. A method of image reconstruction of MRI data from a plurality of receiver coils comprising the steps of:
    a) obtaining k-space data with each of the receiver coils, the k-space data being on a plurality of trajectories in k-space, the k-space data being oversampled in a region near the origin of k-space (central region) corresponding to lower frequencies;
    b) for each coil, establishing k-space data in a full field of view set using k-space data measured by each coil and k-space data measured from other coils;
    c) for each coil establishing k-space data on a k-space location in the full field of view set using a linear combination of measured k-space data in a pattern of k-space locations around a given k-space location in the full field of view sets;
    d) determining linear combination weights for step c) using synthesized k-space data and by identifying in the central region a plurality of instances of the same or similar patterns of k-space locations around the given k-space location using the synthesized k-space data, the synthesized k-space data being derived from measured k-space data in the central region of each coil, and wherein the synthesized k-space data differs from the measured k-space data:
    e) Fourier transforming the k-space data on a the full field of view for each receiver coil in order to provide an MRI data image for each receiver coils; and
    f) combining the images for all coils in order to form a final composite MRI data image.

2. The method of claim 1 wherein synthesized data in the central region in step d) is obtained from k-space data which is filtered in order to suppress image repetitions and in order to form apodized data.

3. The method of claim 2 wherein step f) uses sum of squares of image data in forming the composite image.

4. The method of claim 3 wherein the plurality of trajectories in step a) are spiral trajectories.

5. The method of claim 3 wherein the plurality of trajectories in step a) are radial trajectories.

6. The method of claim 3 wherein the plurality of trajectories in step a) are cone trajectories.

7. The method, as recited in claim 2, where the synthesized data in the central region in step d) is obtained from measured k-space data using a Fourier Transform of a Kaiser-Bessel function.

8. The method, as recited in claim 1, wherein the plurality of trajectories in k-space may be arbitrary or random or non-Cartesian trajectories.

K-space data for each receiver coil image is synthesized on a full field of view (FOV) Cartesian grid. Data points in a FOV can be measured or derived from corresponding data points from other coils. Other k-space samples can be synthesized from a weighted sum or linear combination of the data points as measured or derived from other coils. In determining linear weights, a subset of the entire k-space of each receiver is oversampled compared to the field of view. This region is referred to as the "central" region and is usually in the central part of k-space corresponding to low spatial frequency data. Any unsampled data point in the central region can be synthesized from actual sampled k-space data within the Central region or the coil without reference to data from other coils. An unsampled data point within the central region can be apodized data, or data obtained by filtering k-space data to suppress image content outside of the FOV. In a manifestation of the invention the linear combination weights are determined using the synthesized data by identifying in the central region a plurality of instances of the same or similar patterns of k-space locations around a given k-space location using the synthesized k-space data, where the k-space synthesized data is derived from measured k-space data in the central region of each coil and where the synthesized k-space data differs from the measured k-space data.

* * * * *